(12) United States Patent
Saito et al.

(10) Patent No.: US 7,182,527 B2
(45) Date of Patent: Feb. 27, 2007

(54) OPTICAL TRANSMISSION DEVICE

(75) Inventors: Hidenori Saito, Kanagawa-ken (JP);
Masayuki Sugizaki, Kanagawa-ken (JP); Hiroaki Oohira, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/336,821

(22) Filed: Jan. 23, 2006

(65) Prior Publication Data

US 2006/0127017 A1    Jun. 15, 2006

Related U.S. Application Data

(63) Continuation of application No. 10/902,850, filed on Aug. 2, 2004.

(30) Foreign Application Priority Data

Jul. 31, 2003   (JP)   ............... 2003-204451
Jul. 16, 2004   (JP)   ............... 2004-209490

(51) Int. Cl.
    *G02B 6/26*    (2006.01)
(52) U.S. Cl. ............... 385/92; 385/88; 385/93
(58) Field of Classification Search ........... 385/33–37, 385/88–94
    See application file for complete search history.

(56) References Cited

U.S. PATENT DOCUMENTS

| | | | |
|---|---|---|---|
| 4,867,371 A | 9/1989 | Davis et al. | |
| 6,283,644 B1 * | 9/2001 | Gilliland et al. | 385/93 |
| 6,848,840 B2 * | 2/2005 | Tourne | 385/88 |
| 6,910,812 B2 | 6/2005 | Pommer et al. | |
| 6,952,532 B2 * | 10/2005 | Dair et al. | 398/139 |
| 2004/0252951 A1 * | 12/2004 | Nagasaka et al. | 385/88 |

FOREIGN PATENT DOCUMENTS

| | | |
|---|---|---|
| JP | 58-35507 | 3/1983 |
| JP | 60-120410 | 8/1985 |
| JP | 62-297810 | 12/1987 |
| JP | 4-18806 | 2/1992 |
| JP | 7-41508 | 7/1995 |
| JP | 08-005872 | 12/1995 |
| JP | 8-58872 | 1/1996 |
| JP | 2000-221368 | 8/2000 |
| SE | WO 02/078409 A1 * | 10/2002 |

* cited by examiner

Primary Examiner—Brian Healy
Assistant Examiner—Charlie Peng
(74) Attorney, Agent, or Firm—Oblon, Spivak, McClelland, Maier & Neustadt, P.C.

(57) ABSTRACT

An optical transmission device has a light emission element for converting an electrical signal to an optical signal to transmit it to an optical fiber; a lead frame for mounting the light emission element and having a through hole at a position determined with reference to a mounted position of the light emission element; and a receptacle having a protrusion portion inserted in the through hole to fix a position of the lead frame relatively, and a sleeve into which an end portion of the optical fiber is inserted to fix a position of the optical fiber relatively, the receptacle optically connecting the light emission element and the optical fiber.

16 Claims, 18 Drawing Sheets

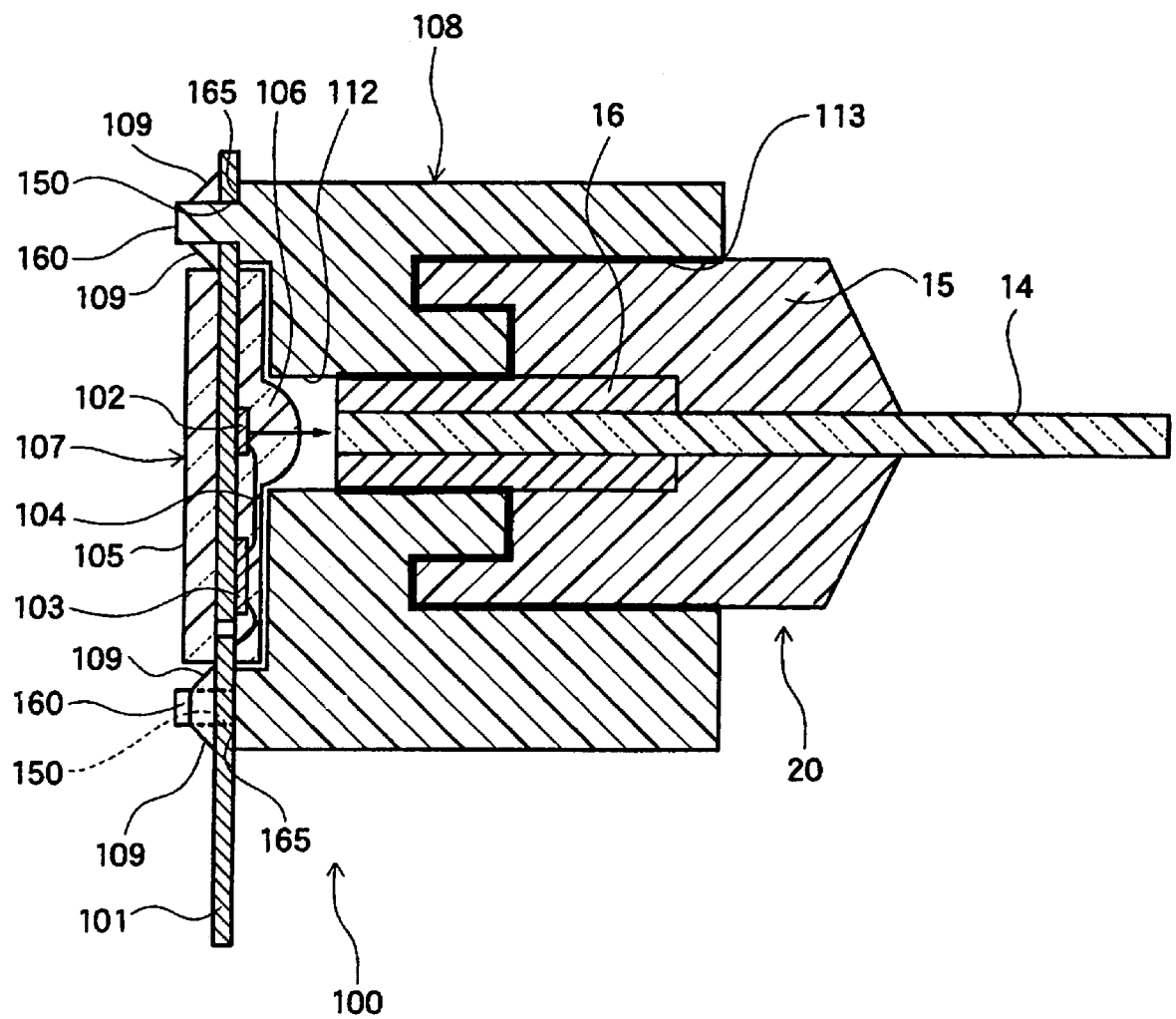
F I G . 1

OPTICAL TRANSMISSION DEVICE

CROSS REFFERENCE TO RELATED APPLICATION

This application is based upon and claims the benefit of priority under 35 §119 to Japanese Patent Applications No. 2003-204451, filed on Jul. 31, 2003; and No. 2004-209490, filed on Jul. 16, 2004, the entire contents of both of which are incorporated by references herein.

BACKGROUND OF THE INVENTION

1. Field of the Invention

The present invention relates to an optical transmission device performing a light transmission through an optical fiber.

2. Descriptions of the Related Arts

Optical transmission devices used between instruments close to each other such as audio visual instruments and FA instruments have mounted 660 nm-band red LEDs, and have been used at transmission speeds ranging from several Mbps to 100 Mbps. As such optical transmission devices, plastic fibers measuring 200 to 980 μm in diameter, which are suitable for a wavelength of 660 nm-band, have been used.

In recent years, as digital devices have become more advanced, a high speed transmission among them has been required. Thus, laser diodes which can operate at a speed higher than LEDs have been used for optical transmission devices. However, since surface emitting-type laser diodes oscillate a laser light of 850 to 1550 nm-band, transmission loss becomes large with usage of the plastic fiber having a core measuring 200 to 980 μm in diameter. Accordingly, to decrease the transmission loss, optical fibers having a core measuring 50 μm in diameter have come to be used.

FIG. 18 is a cross section view showing an outline of a conventional optical transmission device 10 taken along an optical fiber 14 (for example, see Japanese Patent Laid-Open Publication [KOKAI] 2002-344024). The optical transmission device 10 comprises a light emission element 2 mounted on a lead frame 1 and a peripheral IC 3 for driving a light emission element 2. A lead frame 1, a light emission element 2 and a peripheral IC 3 are electrically connected by a gold wire 4. A light emission element 2, a peripheral IC 3 and a gold wire 4 are sealed by resin 5. A lens 6 is formed in front of a light emission surface of a light emission element 2. With such structure described above, a lead frame 1, a light emission element 2, a peripheral IC 3, a gold wire 4, resin 5 and a lens 6 constitute a light emission unit 7.

A receptacle 8 has an insertion port 11 for inserting a light emission unit 7 and a sleeve 12 for inserting an end of a optical fiber 14 which transmits an optical signal. An optical fiber 14 is constituted by a core which forms its center, and a clad surrounding the core, and the core and the clad are not identified in the drawing. A light emission unit 7 is inserted through a insertion port 11 of a receptacle 8, and fixed thereto with adhesive 9. An optical connector 20 is composed of an optical fiber 14, a connecting connector 15 and a ferrule 16. An optical fiber 14 is fitted to a central portion of a ferrule 16, and a tip portion of a ferrule 16 is designed so as to be flush with an end face of an optical fiber 14. Note that the boundary between an optical connector 20 and a receptacle 8 is represented by the thick lines.

By inserting a ferrule 16 in a sleeve 12, the center axis of an optical fiber 14 is positioned in line with the center axis of a sleeve 12. Lights emitted from a light emission element 2 are collected by a lens 6, and enter an optical fiber 14 through a sleeve 12.

When an optical signal enters an optical fiber 14 through a lens 6, an efficiency of coupling between a light emission element 2 and an optical fiber 14 is determined by a positional precision of a lens 6 and an optical fiber 14. Specifically, the efficiency of coupling between a light emission element 2 and an optical fiber 14 becomes higher, as the center axis of a lens 6 agrees more fully with that of an optical fiber 14.

Nevertheless, the size of an inserting port 11 has been made somewhat larger than the measurements of a light emission unit 7. Therefore, a light emission unit 7 deviates from a specified position in a receptacle 8 forward or backward, upward or downward and left or right. Alternatively, a light emission unit 7 occasionally may tilt relative to a receptacle 8. In this case, when a light emission unit 7 is fixed to a receptacle 8 with adhesive 9, it has been difficult to make the center axes of a lens 6 and an optical fiber 14 agree with each other. In other words, in a conventional optical transmission device 10, it has been difficult to determine the relative positions of an optical fiber 14 and a light emission element 2 precisely.

In a case where the diameter of the optical fiber 14 is 200 μm or more, if the center axes of a lens 6 and an optical fiber 14 disagree somewhat with each other, this has an insignificant effect on the efficiency of optically coupling between an optical fiber 14 and a light emission element 2. However, in a case where a diameter of an optical fiber 14 is equal to about 50 μm, the disagreement of the center axes of a lens 6 and an optical fiber 14 with each other has a significant effect on the efficiency of optically coupling between an optical fiber 14 and a light emission element 2. In the future, when a diameter of an optical fiber 14 is set to be further smaller than the present diameter thereof, the disagreement of the center axes of a lens 6 and an optical fiber 14 will have a more significant effect on the efficiency of optically coupling between an optical fiber 14 and a light emission element 2.

The respective center axes of a lens 6 and an optical fiber 14 are not constant among a plurality of optical transmission devices 10. This implies that the efficiency of coupling between an optical fiber 14 and a light emission element 2 varies for each optical transmission device 10.

SUMMARY OF THE INVENTION

An optical transmission device according to an embodiment of the present invention comprises: a photonic element converting an electrical signal received from an optical transmission path to an optical signal, or converting an optical signal received from the optical transmission path to an electrical signal; a mounting board mounting the photonic element and having one of a hole and a notch at a position determined with reference to a mounted position of the photonic element; and a coupling portion having a protrusion portion inserted in one of the hole and the notch to relatively fix a position of the mounting board, and an optical transmission path insertion port in which an end portion of the optical transmission path is inserted and which relatively fixes a position of the optical transmission path, the coupling portion optically coupling the photonic element and the optical transmission path.

BRIEF DESCRIPTION OF THE DRAWINGS

FIG. 1 is a cross section view showing an outline of an optical transmission device taken along an optical fiber according to Embodiment 1 of the present invention.

DETAILED DESCRIPTION OF THE INVENTION

Figure 2:
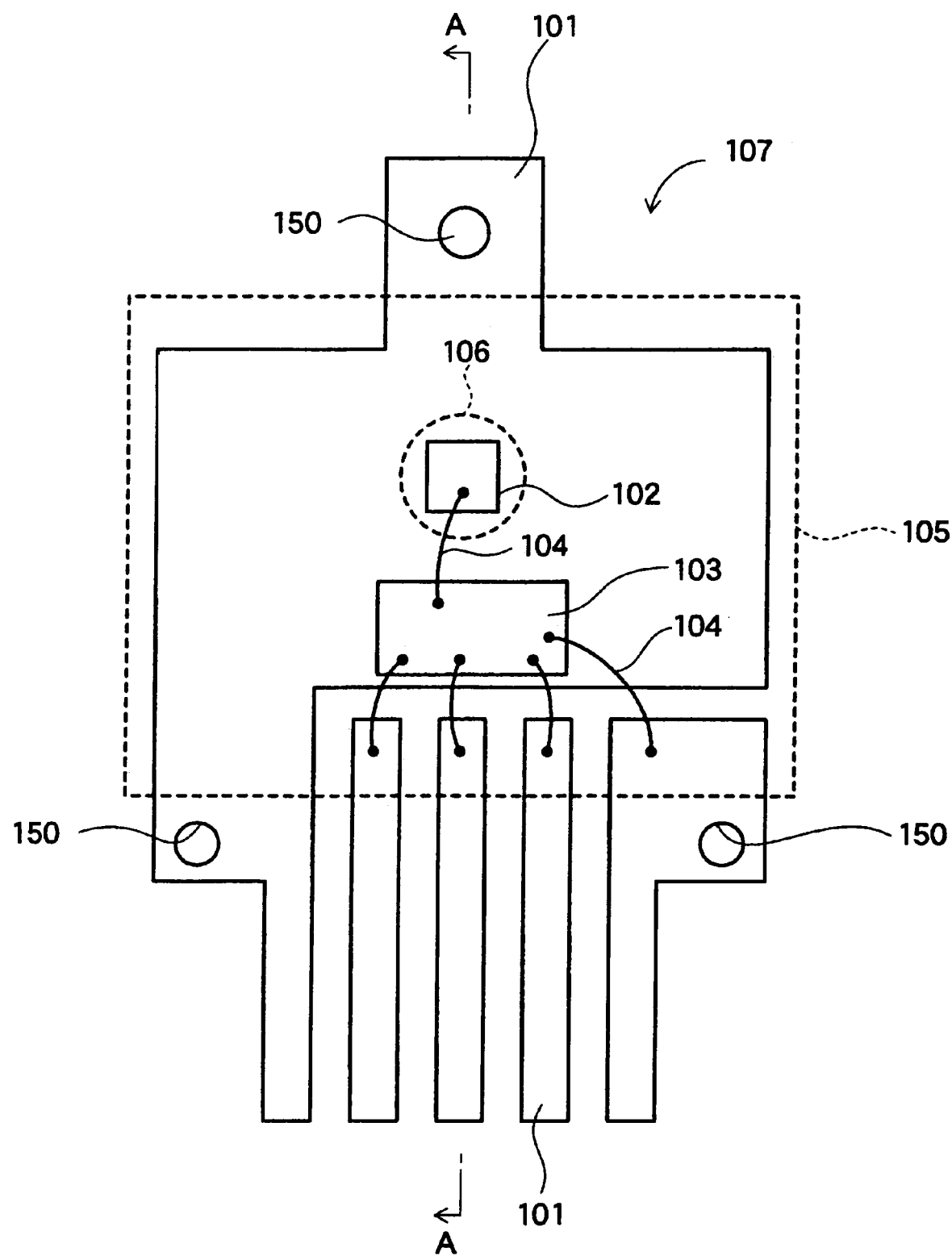
FIG. 2 is a front view showing an outline of a light emission unit of the optical transmission device according to Embodiment 1 of the present invention.

Embodiments of the present invention will be described with reference to the accompanying drawings below. In the drawings described below, the same reference numerals and codes are given to the same constituent components illustrated in certain drawings. Furthermore, an optical fiber is composed of a core at its center, and a clad surrounding the core. No identification between them is made in the following drawings.

(Embodiment 1)

An optical transmission device according to Embodiment 1 of the present invention will be described with reference to FIG. 1 and FIG. 2. FIG. 1 is a cross section view showing an outline of an optical transmission device 100 taken along an optical fiber 14 which is an optical transmission path thereof. Note that, in this cross section view, the constituent components which do not appear in the cross section are virtually illustrated additionally. An optical transmission device 100 comprises a light emission unit 107 and a receptacle 108 that is a coupling portion.

A light emission unit 107 includes a lead frame 101 that is a mounting board, a light emission element. 162 that is a photonic element, a peripheral IC 103, a gold wire 104, a sealing resin 105 and a lens 106. A lead frame 101 is made of a metal, and mounts a light emission element 102 and a peripheral IC 103. If an automatic mounter is used in mounting a light emission element 102 on a lead frame 101, a light emission element 102 can be fixed to a predetermined position of a lead frame 101 with high precision. A lead frame 101, a light emission element 102 and a peripheral IC 103 are electrically connected by a gold wire 104. A light emission element 102 is operated by a peripheral IC 103, and converts an electrical signal supplied from a peripheral IC 103 to an optical signal. For example, a light emission element 102 that is a surface emitting-type laser diode emits an optical signal in the direction indicated with an arrow in FIG. 1.

A light emission element 102, a peripheral IC 103 and a gold wire 104 are sealed by sealing resin 105. This sealing procedure is performed by, for example, a transfer mold filling, and thus precise positioning of a lens 106 is facilitated. A lens 106 is provided in resin 105 in order to take out the optical signal from a light emission element 102 with high efficiency.

FIG. 2 is a front view showing an outline of a light emission unit 107 on which a light emission element 102 and a peripheral IC 103 are mounted. As shown in FIG. 2, through holes 150, for example three of them, which are holes penetrating through a lead frame 101 in its direction of thickness are provided at positions determined relative to a mounted position of a light emission element 102. The through holes 150 are disposed symmetrically to the line A—A passing through a light emission element 102. The outer edge of sealing resin 105 and the outer edge of a lens 106 are indicated by the broken lines. FIG. 1 shows a cross section view of an optical transmission device 100 taken along the line A—A shown in FIG. 2.

A receptacle 108 that is an optical coupling portion will be described with reference to FIG. 1 again. A receptacle 108 comprises a sleeve 112 that is an optical transmission path insertion port for inserting an end portion of an optical fiber 14, and a receiving portion 113 for receiving a connecting connector 15. A receptacle 108 is typically made of resin. In a sleeve 112, the end portion of an optical fiber 14 is inserted, and thus a sleeve 112 fixes the position of the end portion of an optical fiber 14 relative to a receptacle 108. A connecting connector 15 is received by a receiving portion 113, whereby the length of an optical fiber 14 inserted in a sleeve 112 is determined.

A receptacle 108 further comprises protrusion portions 160 fitting the through holes 150. Through holes 150 and protrusion portions 160 are provided in equal numbers, for example, three. The diameter of through holes 150 and the cross-section diameter of protrusion portions 160 when viewed from its protrusion direction are approximately equal. Accordingly, when protrusion portions 160 are inserted in through holes 150, both of protrusion portions 160 and through holes 150 almost contact with each other, and the position of a light emission element 102 relative to a receptacle 108 is fixed. As described above, a receptacle 108 relatively determines the position of the end portion of an optical fiber 14 and the position of a light emission element 102, thus optically connecting a light emission element 102 and an optical fiber 14.

The diameter of a connecting portion 165 near the base of a protrusion portion 160 is larger than that of a through hole 150. Thus, a lead frame 101 firmly contacts connecting portions 165, whereby the distance between a light emission element 102 and a receptacle 108 is determined.

Figure 18:
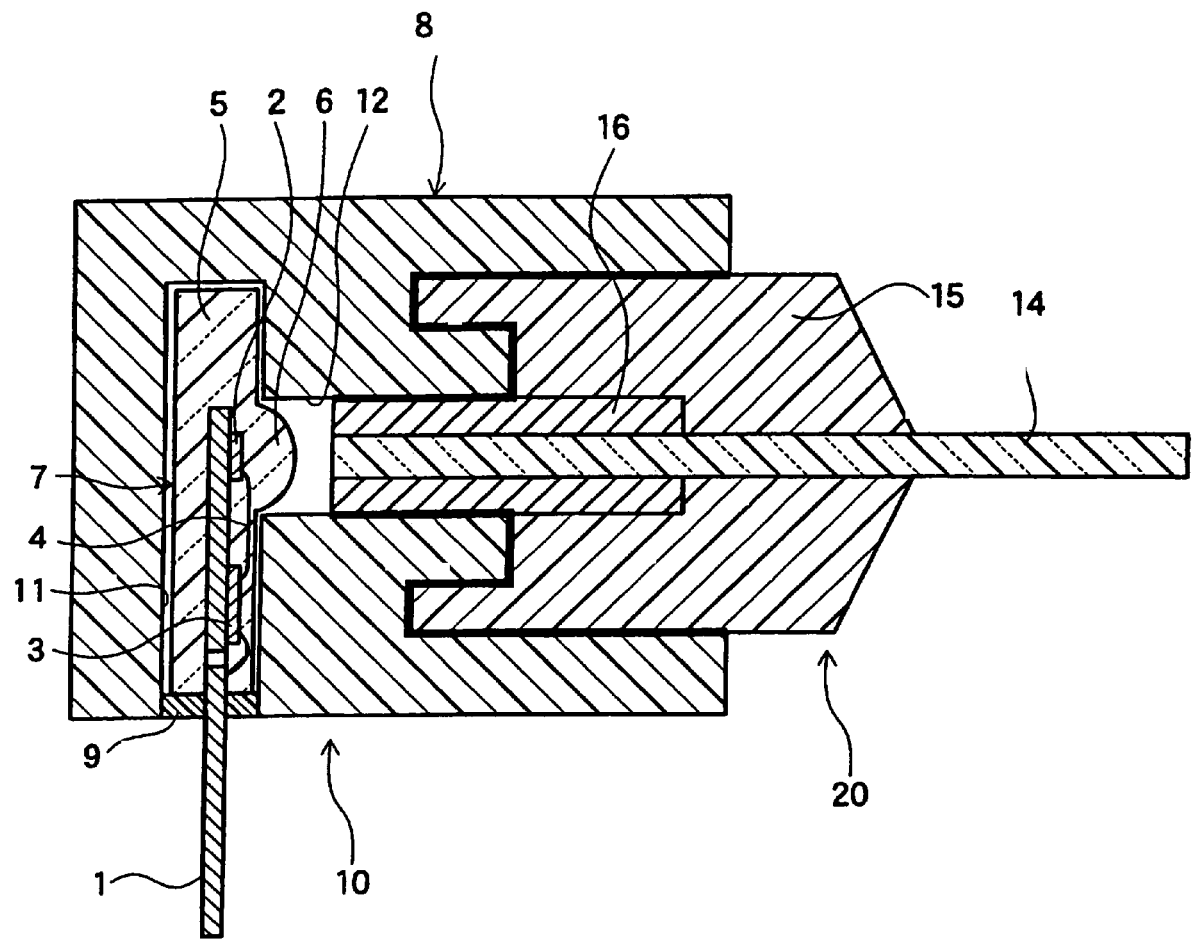
FIG. 18 is a cross section view showing an outline of a conventional optical transmission device taken along an optical fiber.

After protrusion portions 160 are inserted in through holes 150, adhesive 109 is supplied to protrusion portions 160 and through holes 150. Thus, the position of a light emission element 102 relative to a receptacle 108 and the distance between a light emission element 102 and a receptacle 108 are determined. In the above described manner, the position of a light emission element 102 or a lens 106 relative to an optical fiber 14 is determined. Since an optical connector 20 is identical to that shown in FIG. 18, descriptions of it will be omitted.

The shape of through holes 150 is circular as shown in FIG. 2. The cross-section shape of protrusion portions 160 is also circular as is the case with that of through holes 150. However, according to this embodiment, since through holes 150 and protrusion portions 160 are provided in plural numbers, the position of the end portion of an optical fiber 14 and the position of a light emission element 102 relative to a receptacle 108 are determined in a mechanical manner, respectively. Accordingly, an optical fiber 14, a light emission element 102 and a lens 106 can be fixed to predetermined positions relative to a sleeve 112, respectively. As a result, an efficiency of optically coupling between an optical transmission device 100 and an optical connector 20 becomes stable. Specifically, a variation of the efficiency of optically coupling between each optical transmission device 100 becomes smaller than conventional one.

Furthermore, through holes 150 and protrusion portions 160 are provided at precise positions relative to a light emission unit 107 and a receptacle 108 respectively, and the diameters of protrusion portions 160 and through holes 150 are made to be almost equal to each other, whereby an efficiency of optically coupling between an optical fiber 14 and a light emission element 102 increases in comparison with conventional ones.

In this embodiment, in consideration for manufacturability of an optical transmission device 100, through holes 150 are provided in a lead frame 101, and protrusion portions 160 are provided in a receptacle 108. However, protrusion portions may be provided in a lead frame 101 and through holes may be provided in a receptacle 108.

(Embodiment 2)

Figure 3:
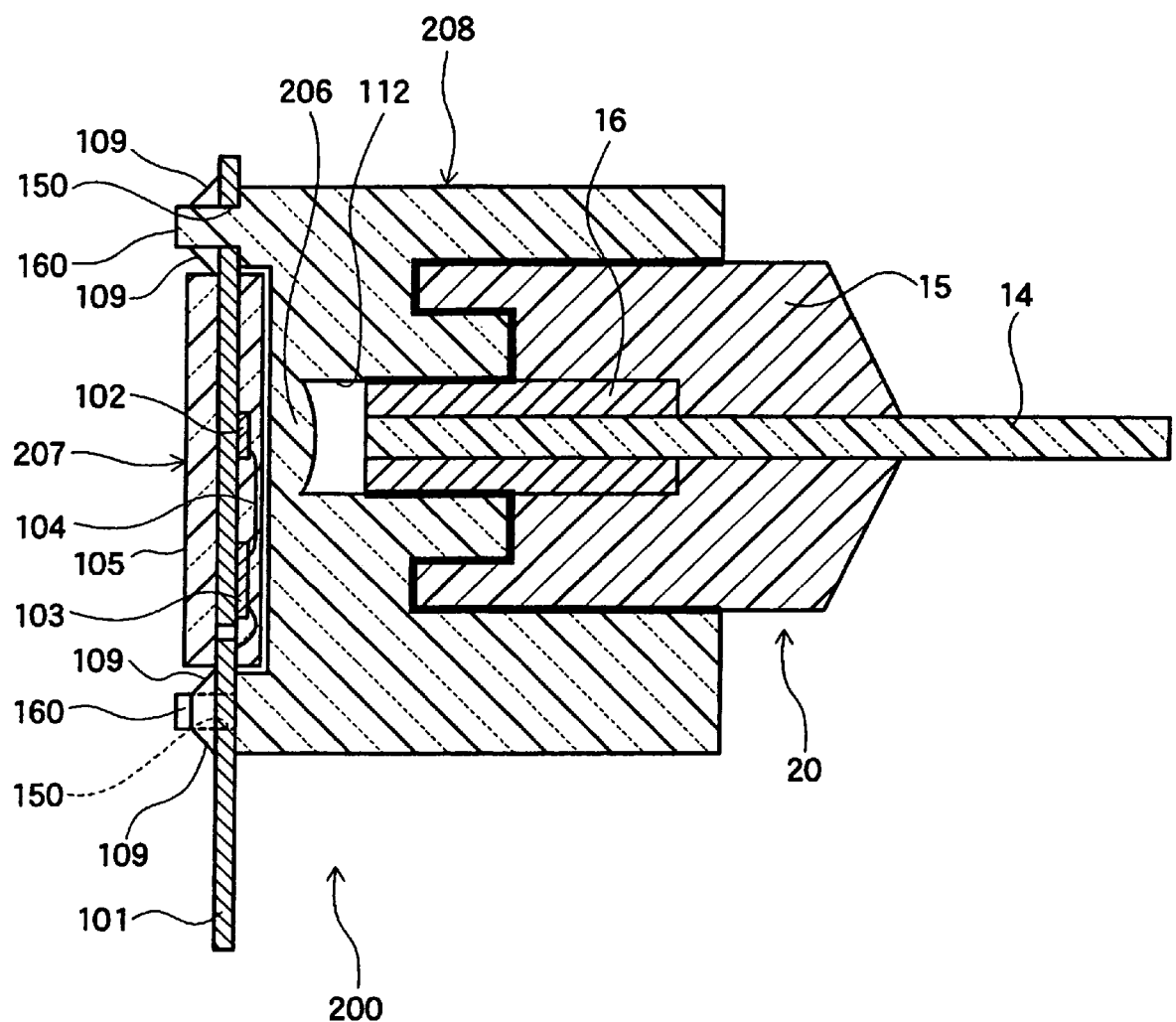
FIG. 3 is a cross section view showing an outline of an optical transmission device taken along an optical fiber according to Embodiment 2 of the present invention.

An optical transmission device according to Embodiment 2 of the present invention will be described with reference to FIG. 3. FIG. 3 is a cross section view showing an outline of an optical transmission device 200 taken along an optical fiber 14 that is an optical transmission path thereof. Note that, in this section view, the constituent components which do not appear in the cross section are virtually illustrated additionally. This embodiment differs from Embodiment 1 in that a light emission unit 207 has no lens and a lens 206 is provided in a receptacle 208. Other constituent components of this embodiment may be the same as those in Embodiment 1.

According to this embodiment, a lens 206 which collects optical signals from a light emission element 102 is formed as-one with a receptacle 208. A lens 206 needs to be translucent. Accordingly, when a lens 206 and a receptacle 208 are formed as-one, the entire of a receptacle 208 is also translucent. A lens 206 is provided at the end of a sleeve 112 so that the center axis of a lens 206 and the center axis of a sleeve 112 agree with each other.

In FIG. 3, a gap between a receptacle 208 and resin 105 exists. However, the gap between a receptacle 208 and resin 105 needs not exist. Specifically, a receptacle 208 and resin 105 may be brought into intimate contact with each other.

By providing a lens 206 in a receptacle 208, the center axis of a lens 206 agrees with that of a sleeve 112 without depending on the position of a light emission unit 207 relative to a receptacle 208. Thus, it is possible to position the center axis of a lens 206 so as to be flush with that of an optical fiber 14. As a result, the efficiency of optically coupling between an optical transmission device 200 and an optical connector 20 increases and becomes stable in comparison with conventional ones. Furthermore, Embodiment 2 exhibits the same effects as those in Embodiment 1.

The front view of a light emission unit 207 is approximately identical to that shown in FIG. 2, and is omitted. Since a lens is not formed on sealing resin 105, a lens 106 shown by the broken line in FIG. 2 is not present in this embodiment.

(Embodiment 3)

Figure 4:
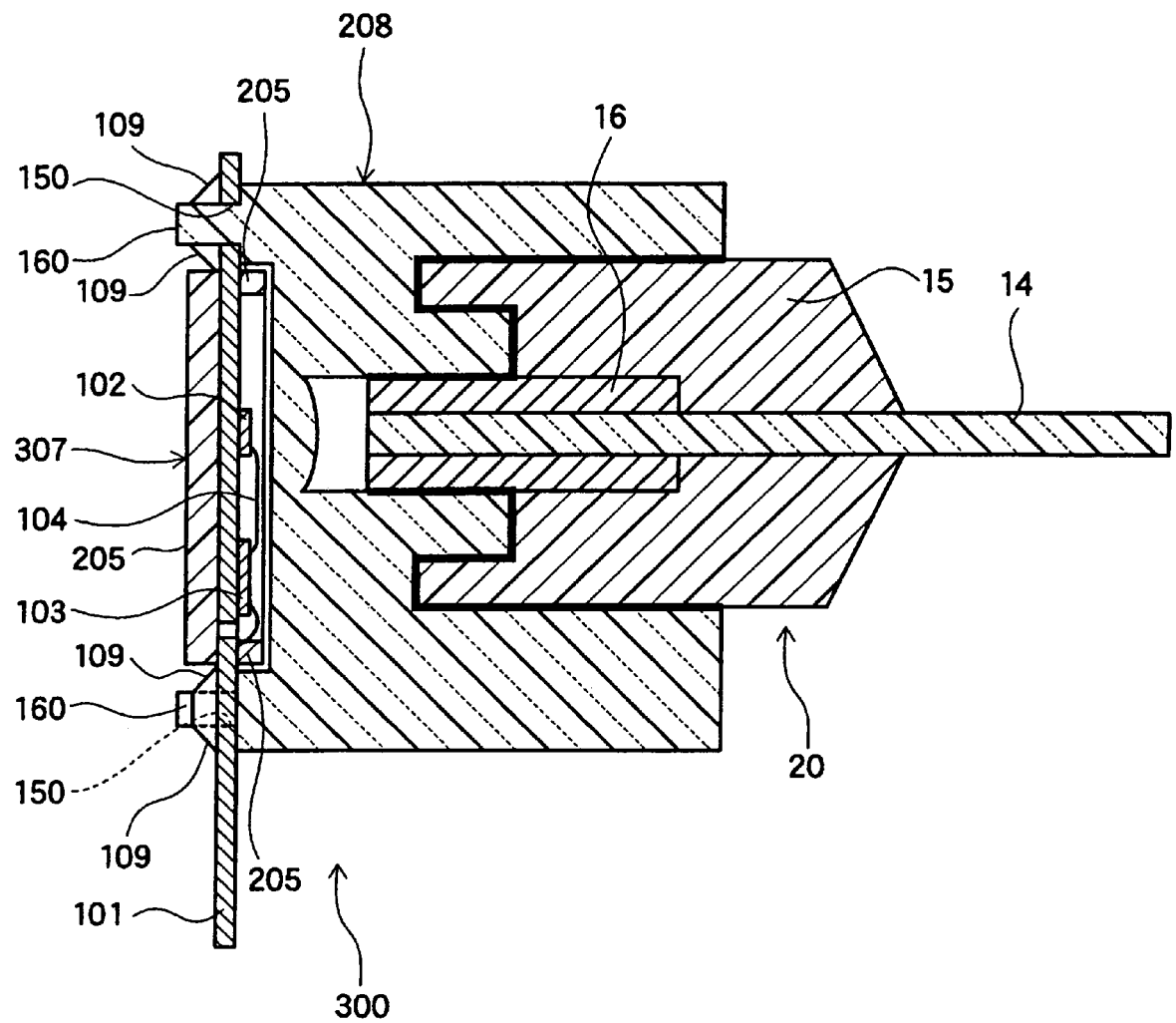
FIG. 4 is a cross section view showing an outline of an optical transmission device taken along an optical fiber according to Embodiment 3 of the present invention.

An optical transmission device according to Embodiment 3 of the present invention will be described with reference to FIGS. 4 and 5. FIG. 4 is a cross section view showing an outline of an optical transmission device 300 taken along an optical fiber 14 that is an optical transmission path thereof. Note that, in this cross section view, the constituent components which do not appear in the cross section are virtually illustrated additionally. In a light emission unit 307 according to this embodiment, both of a light emission element 102 and a peripheral IC 103 are not resin-sealed. A resin 205 is provided on a lead frame 101 so as to surround a light emission element 102 and a peripheral IC 103. This embodiment differs from Embodiment 2 in such respect. Other constituent components of this embodiment may be the same as those of Embodiment 2.

When a light emission unit 307 is fitted to a receptacle 208, a light emission unit 102 and a peripheral IC 103 are hermetically sealed in a hollow space surrounded by a lead frame 101, a receptacle 208 and resin 205.

According to this embodiment, since resin 205 does not come into direct contact with a light emission element 102, a light emission element 102 does not deteriorate owing to the stress of the resin. Furthermore, since reflection and refraction by the resin does not occur, influences by the resin on an optical axis of a light emission element 102 can be eliminated. Furthermore, this embodiment can achieve the same effects as those in Embodiment 2.

Figure 5:
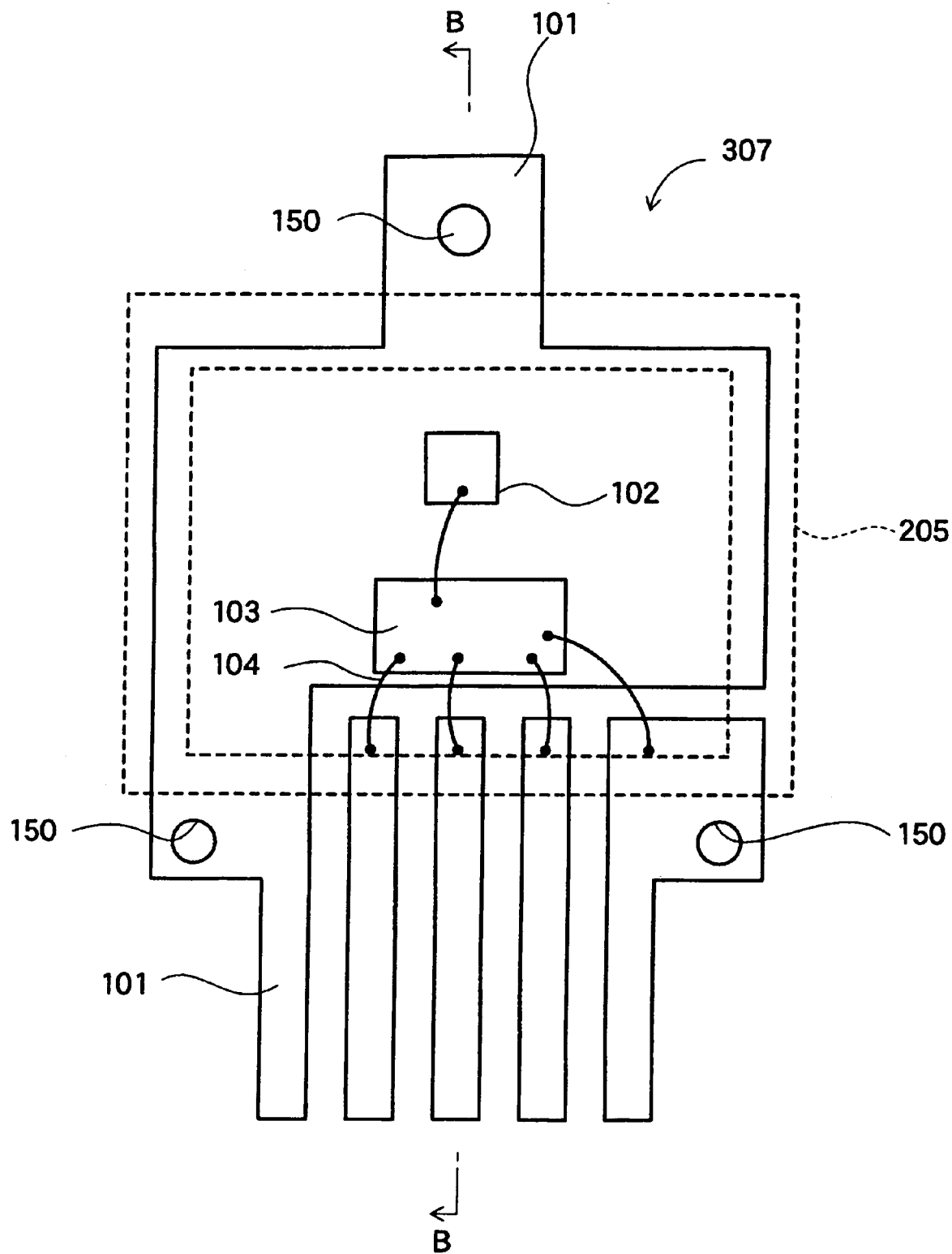
FIG. 5 is a front view showing an outline of a light emission unit of the optical transmission device according to Embodiment 3 of the present invention.

FIG. 5 is a front view illustrating an outline of a light emission unit 307 showing the position of resin 205 relative to a lead frame 101. Resin 205 is illustrated by the broken lines. Resin 205 is provided on a lead frame 101 so as to surround a light emission element 102 and a peripheral IC 103. FIG. 4 shows a section of an optical transmission device 300 taken along the line B—B illustrated in FIG. 5.

(Embodiment 4)

Figure 6:
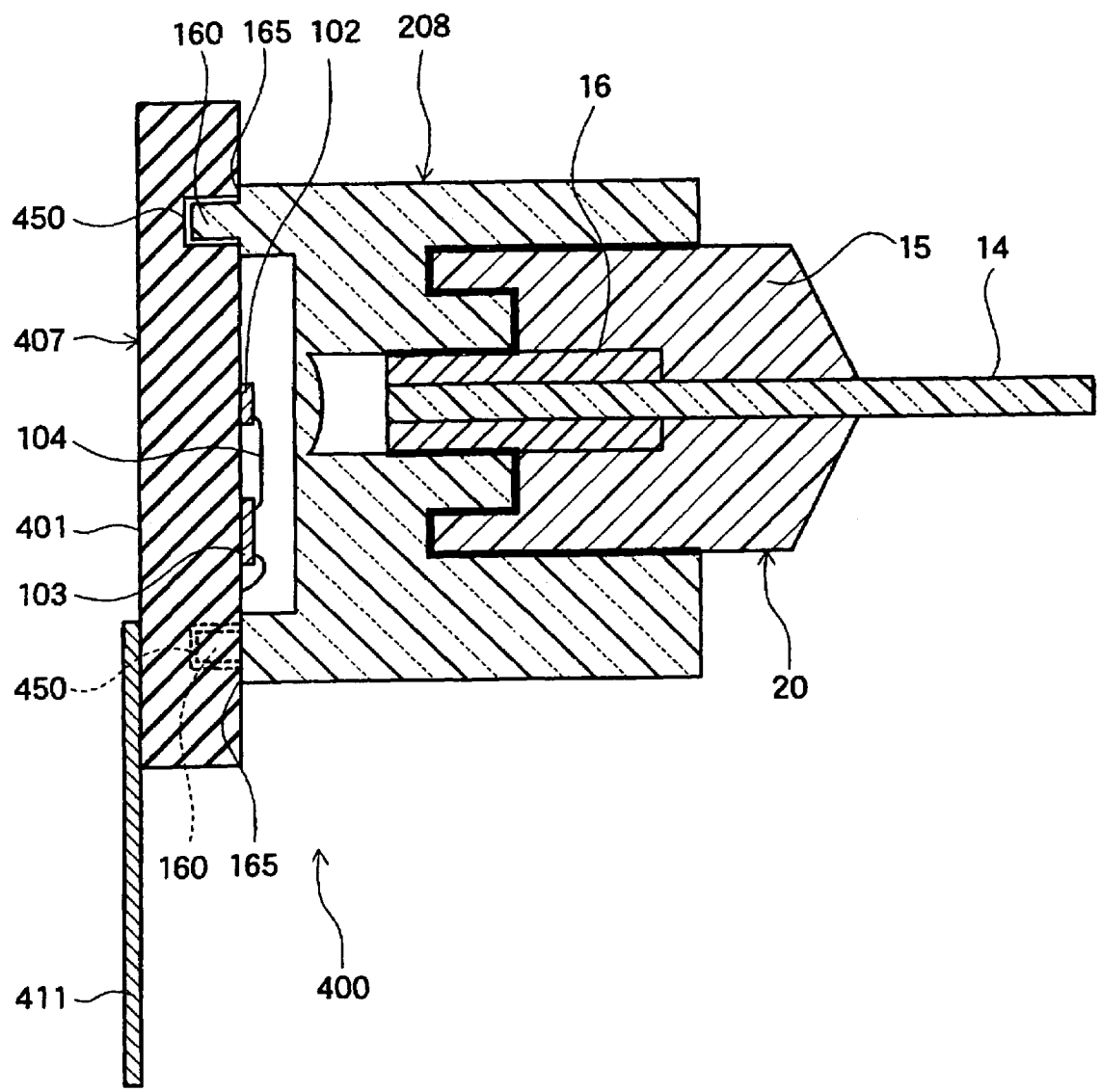
FIG. 6 is a cross section view showing an outline of an optical transmission device taken along an optical fiber according to Embodiment 4 of the present invention.

An optical transmission device according to Embodiment 4 of the present invention will be described with reference to FIG. 6. FIG. 6 is a cross section view showing an outline of an optical transmission device 400 taken along an optical fiber 14 that is an optical transmission path thereof. Note that, in this cross section view, the constituent components which do not appear in the cross section are virtually illustrated additionally. In a light emission unit 407 according to this embodiment, both of a light emission unit 102 and a peripheral IC 103 are mounted on a ceramic board 401, and they are not resin-sealed. This embodiment differs from Embodiment 2 in this respect. Other constituent components of this embodiment may be the same as those of Embodiment 2.

In a ceramic board 401, non-through holes 450 are provided. By fitting protrusion portions 160 in holes 450, the positions of a light emission element 102 and a receptacle 208 are relatively determined.

Since a ceramic board 401 is ordinarily thicker than a lead frame, holes 450 can be provided in a ceramic board 401 as non-through holes. By forming holes 450 to be unpenetrated, it is possible to fix a light emission unit 407 to a receptacle 208 by adhering a light emission unit 407 to a receptacle 208 or inserting a light emission unit 407 in a receptacle 208. A ceramic board 401 firmly contacts connecting portions 165, whereby the distance between a light emission unit 102 and a receptacle 208 is determined. Note that a ceramic board 401 may take any of a single-layered structure and a multilayered structure, and a wiring formed on the surface where a light emission unit 102 and the like are mounted and a lead wire 411 connected to the surface on the other side of the former plane are connected to each other by, for example, a via-hole wiring (not shown).

According to this embodiment, a light emission element 102 and a peripheral IC 103 are hermetically sealed in a hollow space surrounded by a ceramic board 401 and a receptacle 208. Accordingly, this embodiment exhibits the same effects as those in Embodiment 3.

Though non-through holes 450 are provided in a ceramic board 401 of this embodiment, the effects of this embodiment are not lost even when through holes (not shown) are provided in a ceramic board 401.

(Embodiment 5)

Figure 7:
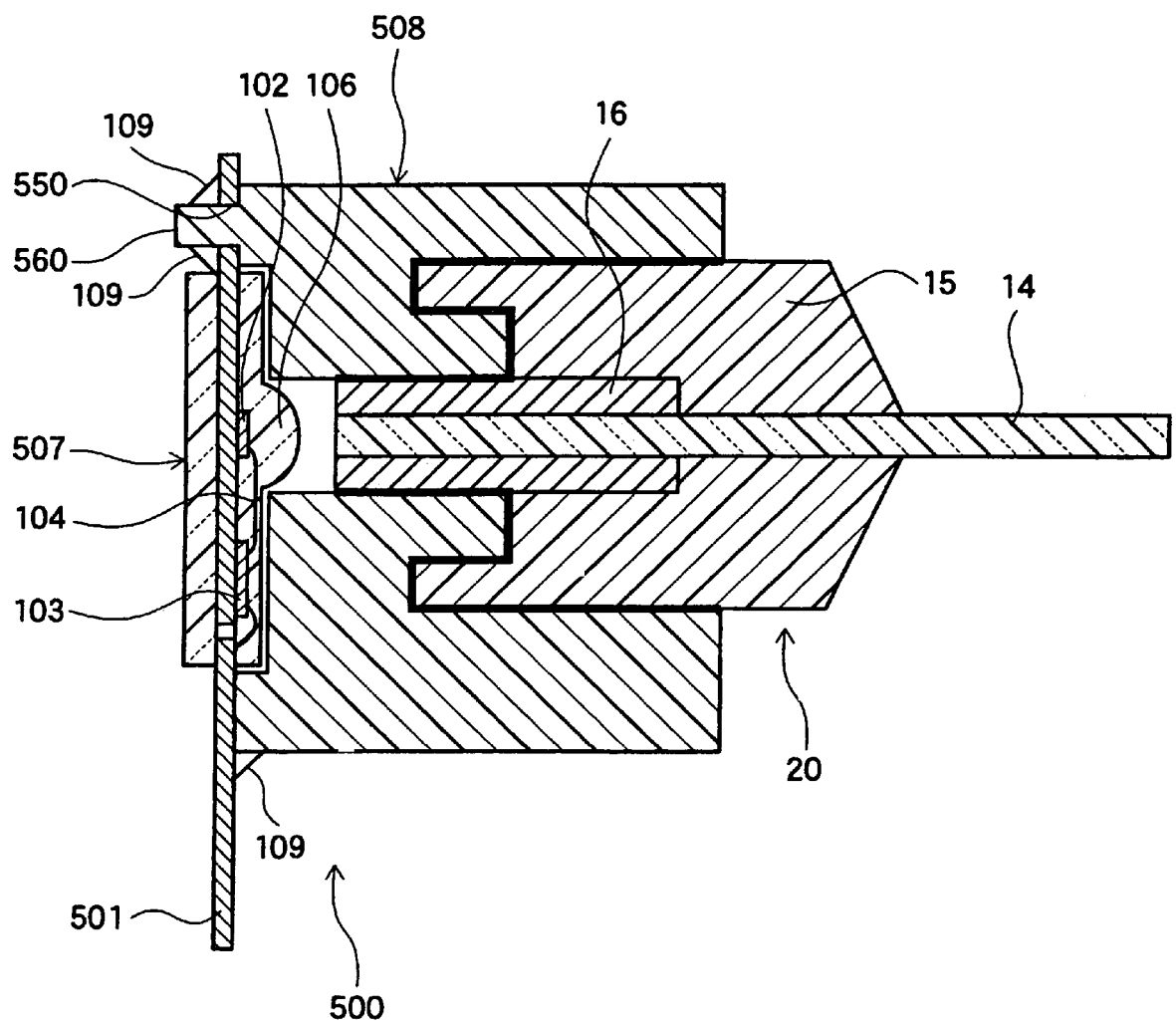
FIG. 7 is a cross section view showing an outline of an optical transmission device taken along an optical fiber according to Embodiment 5 of the present invention.

An optical transmission device according to Embodiment 5 of the present invention will be described with reference to FIGS. 7 and 8. FIG. 7 is a cross section view showing an outline of an optical transmission device 500 taken along an optical fiber 14 that is an optical transmission path thereof. Note that, in this cross section view, the constituent components which do not appear in the cross section are virtually illustrated additionally. In this embodiment, the number of through hole 550 provided in a lead frame 501 is one, and has a polygonal shape having three corners or more. The number of protrusion 560 provided in a receptacle 508 is one as is the case with a through hole 550, and the protrusion takes a polygonal shape having three corners or more in a section perpendicular to its protrusion direction. This embodiment differs from Embodiment 1 in this respect. Other constituent components of this embodiment may be the same as those of Embodiment 1.

Figure 8:
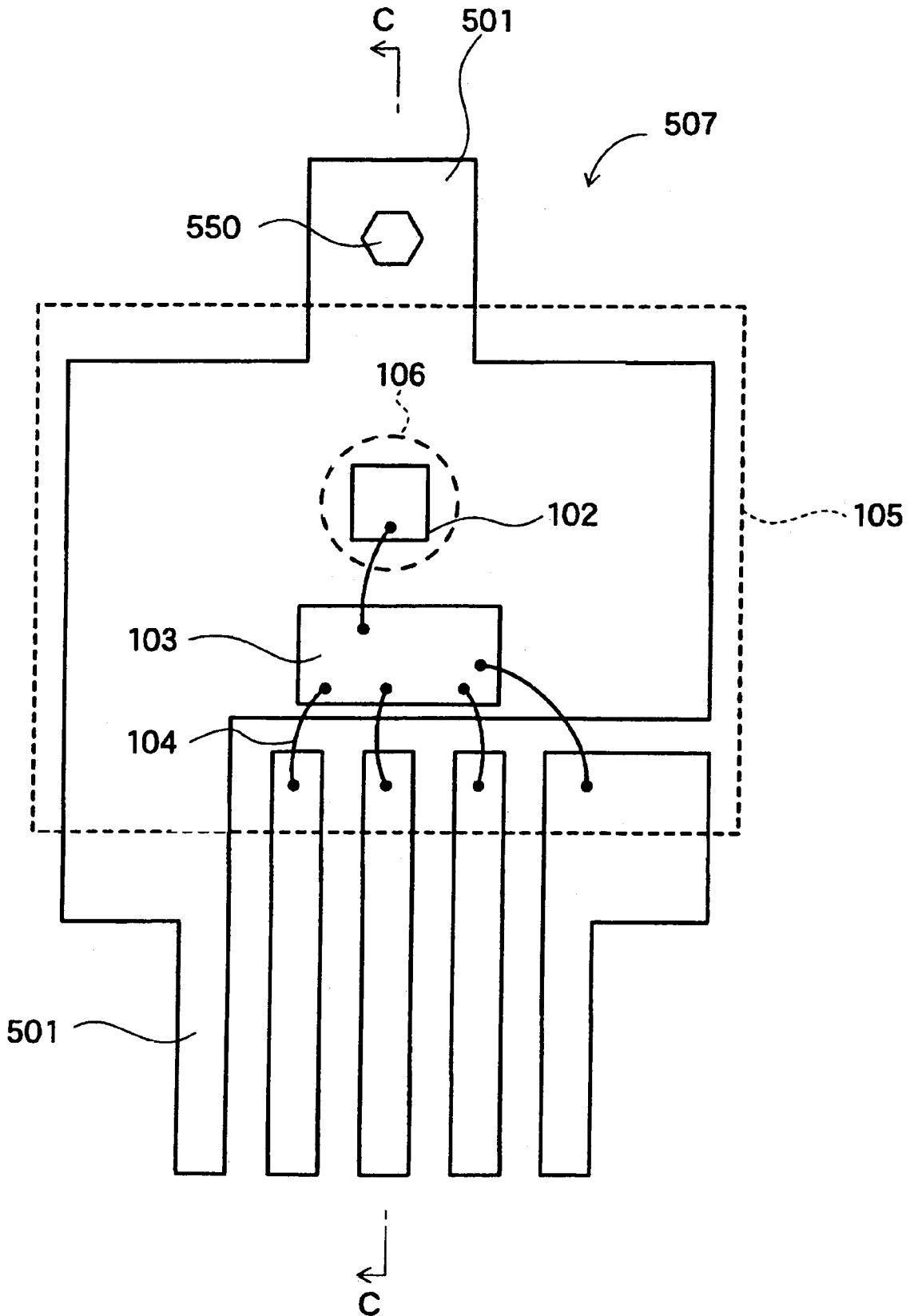
FIG. 8 is a front view showing an outline of a light emission unit of the optical transmission device according to Embodiment 5 of the present invention.

FIG. 8 is a front view showing an outline of a light emission unit 507 having a lead frame 501. According to this embodiment, only one through hole 550 is provided in a lead frame 501, and has, for example, a hexagonal shape. In accordance with this, only one protrusion 560 (not shown) is provided in a receptacle 508, and has a hexagonal shape. A through hole 550 and a protrusion 560 are formed to a hexagonal shape having an approximately equal size and identical shape. With such constitution, a through hole 550 can accept a protrusion 560. FIG. 7 shows a cross section view of an optical transmission device 500 taken along the line C—C shown in FIG. 8.

According to this embodiment, since only one through hole 550 and one protrusion 560 are provided, a through hole 550 and a protrusion 560 are formed to be polygonal. Accordingly, the position of a light emission unit 507 relative to a receptacle 508 is determined. Furthermore, this embodiment exhibits the same effects as those in Embodiment 1.

In this embodiment, a though through hole 550 and a protrusion 560 are polygonal, the same effects as those of this can be obtained when a through hole 550 and a protrusion 560 are formed to be elliptic.

(Embodiment 6)

Figure 9:
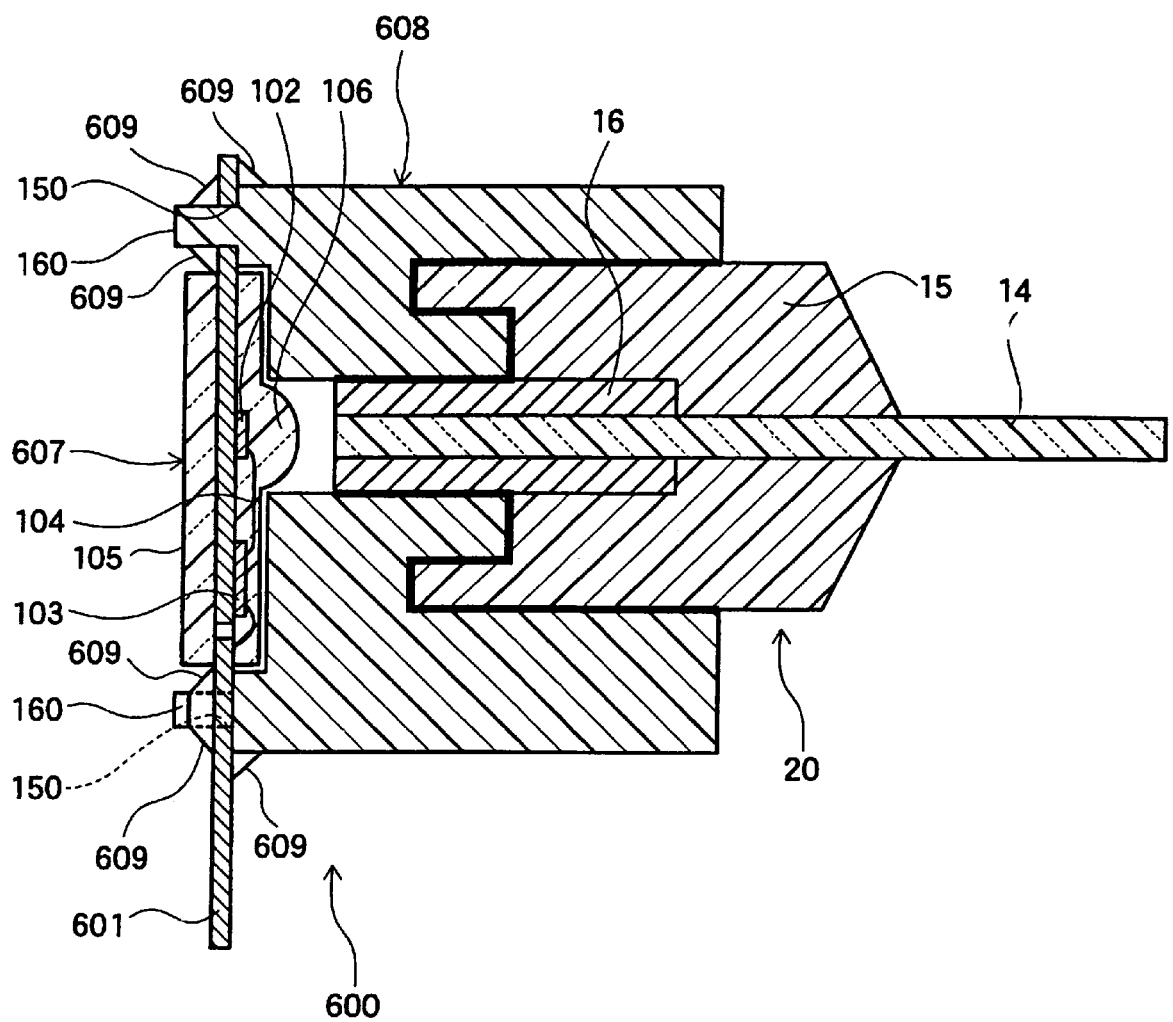
FIG. 9 is a cross section view showing an outline of an optical transmission device taken along an optical fiber according to Embodiment 6 of the present invention.

An optical transmission device according to Embodiment 6 of the present invention will be described with reference to FIG. 9. FIG. 9 is a cross section view showing an outline of the optical transmission device taken along an optical fiber 14 that is an optical transmission path thereof. Note that, in this cross section view, the constituent components which do not appear in the cross section are virtually illustrated additionally. In this embodiment, a lead frame 601 and a receptacle 608 are made of metals having an affinity for solder. Furthermore, a light emission unit 607 and a receptacle 608 are fixed to each other with solder 609. This embodiment differs from Embodiment 1 in this respect. Other constituent components of this embodiment are the same as those of Embodiment 1. This embodiment exhibits the same effects as those in Embodiment 1. Note that since the front view of a light emission unit 607 having a lead frame 601 is the same as that of FIG. 1, the front view thereof is omitted.

(Embodiment 7)

Figure 10:
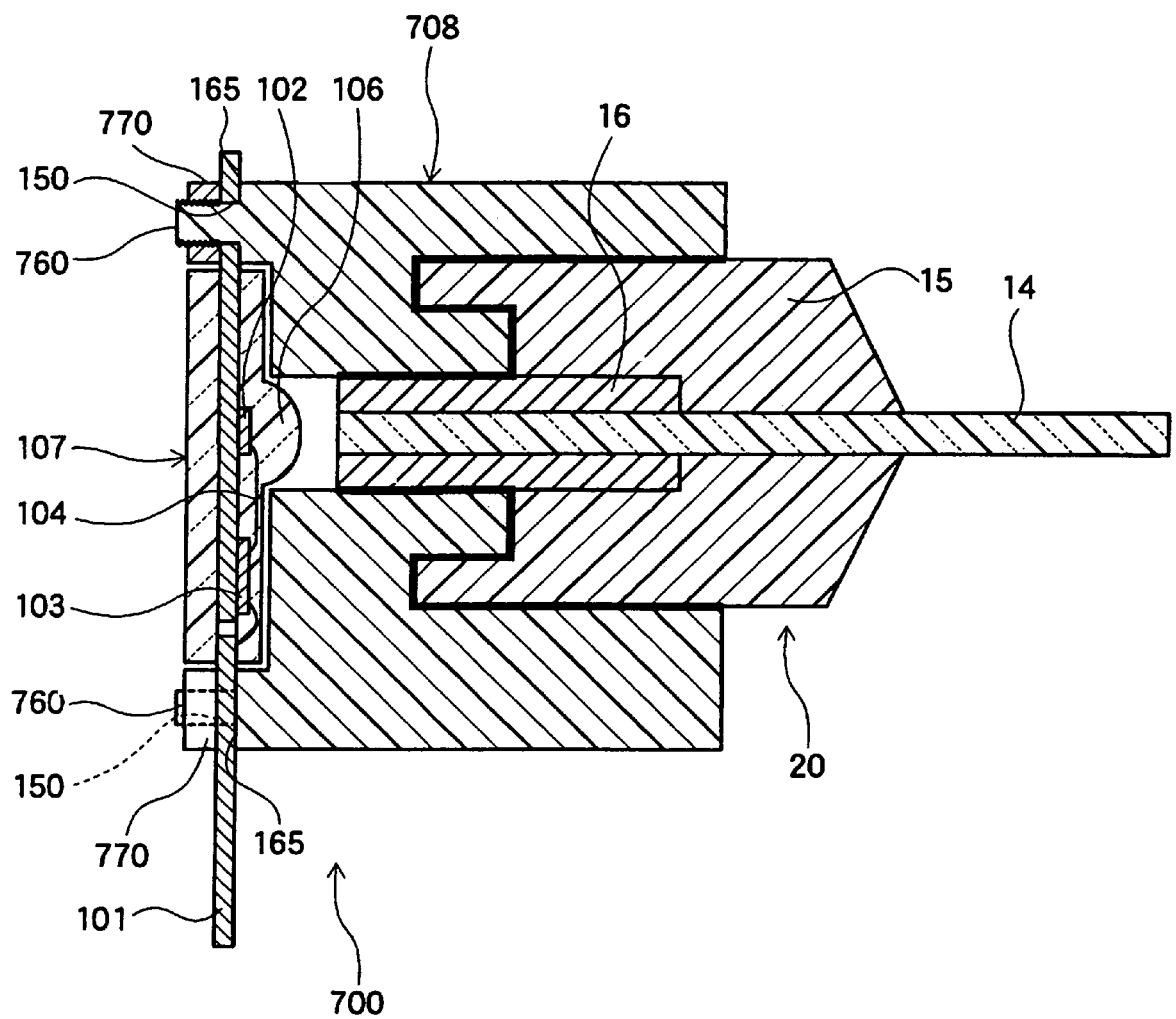
FIG. 10 is a cross section view showing an outline of an optical transmission device taken along an optical fiber according to Embodiment 7 of the present invention.

An optical transmission device according to Embodiment 7 of the present invention will be described with reference to FIG. 10. FIG. 10 is a cross section view showing an outline of an optical transmission device 700 taken along an optical fiber 14 that is an optical transmission path thereof. Note that, in this cross section view, the constituent components which do not appear in the cross section are virtually illustrated additionally. This embodiment differs from Embodiment 1 in that a light emission unit 107 is screwed to a receptacle 708. A protrusion portion 760 of a receptacle 708 has a screw-groove on its side surface. A shape in the section of protrusion portions 760 is approximately the same as that of through holes 150 of a lead frame 101. Accordingly, protrusion portions 760 are accepted in through holes 150 as is the case with Embodiment 1.

After protrusion portions 706 are accepted in through holes 150, nuts 770 are fitted on protrusion portions 760. A lead frame 101 is firmly contacted with a connecting portion 165 of a protrusion portion 760, whereby the distance between a light emission element 102 and a receptacle 708 is determined. Thus, in this embodiment, a light emission unit 107 can be fixed to a receptacle 708 without using adhesive or solder. This embodiment exhibits the same effects as those in Embodiment 1.

(Embodiment 8)

Figure 11:
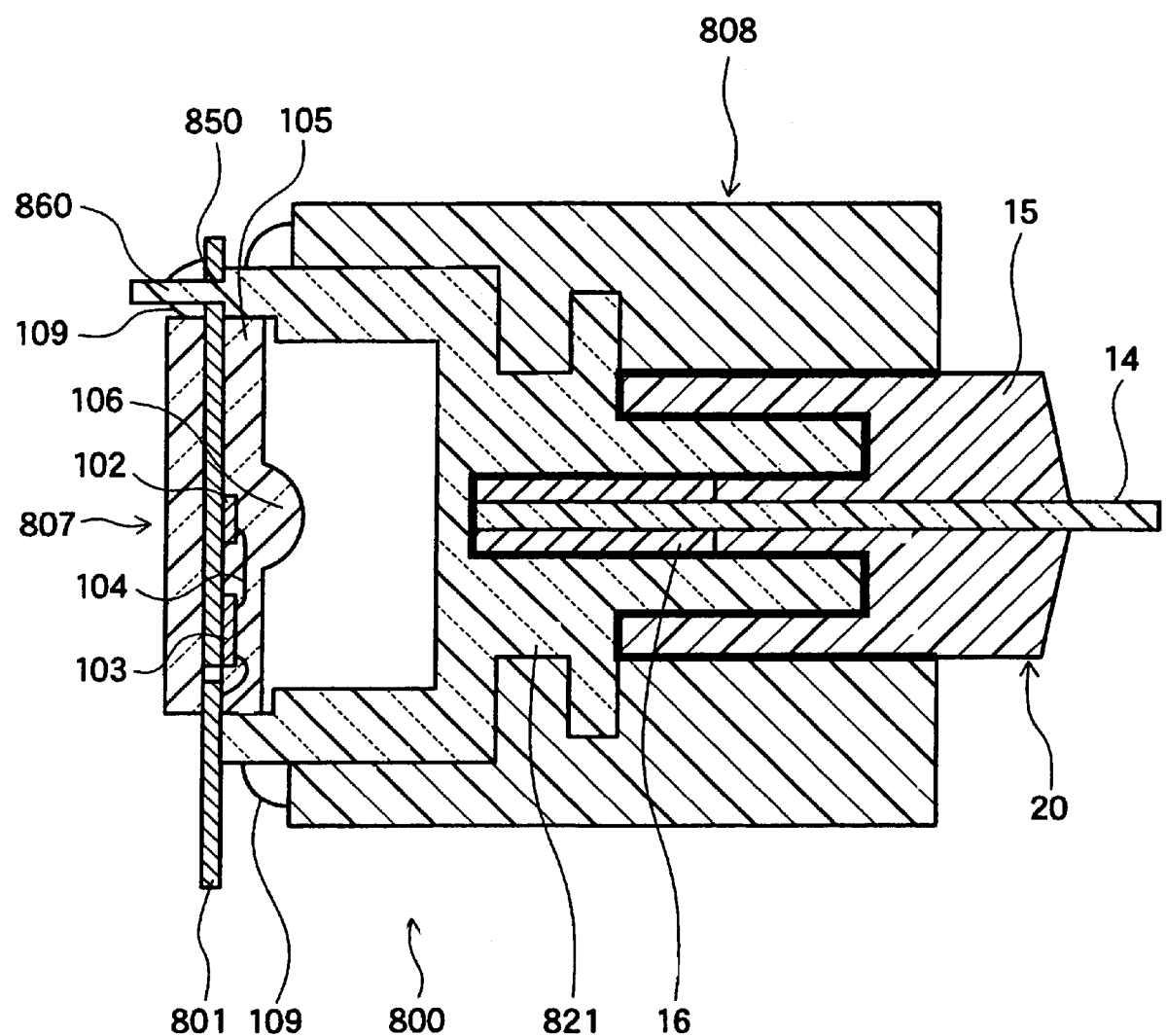
FIG. 11 is a cross section view showing an outline of an optical transmission device taken along an optical fiber according to Embodiment 8 of the present invention.

An optical transmission device according to Embodiment 8 of the present invention will be described with reference to FIG. 11 and FIGS. 12(a) and 12(b). FIG. 11 is a cross section view showing an outline of an optical transmission device 800 taken along an optical fiber 14 that is an optical transmission path thereof. Note that, in this cross section view, the constituent components which do not appear in the cross section are virtually illustrated additionally. This embodiment is different from Embodiments 1 to 7 in that an optical transmission device of this embodiment further comprises a sleeve member 821 in addition to a receptacle 808 as a coupling portion for optically coupling a light emission element 102 to an optical fiber 14. Although, with such constitution, the structures of a connecting connector 15 and a ferrule 16 are somewhat changed, descriptions will be made by giving the same reference numerals and codes and the same names as those of the above described embodiments to the corresponding constituent components. Although a light emission unit 807 differs from a light emission unit 107 shown in FIG. 1 in a lead frame 801, other constituent components may be the same as those of the above described embodiments.

Figure 12:
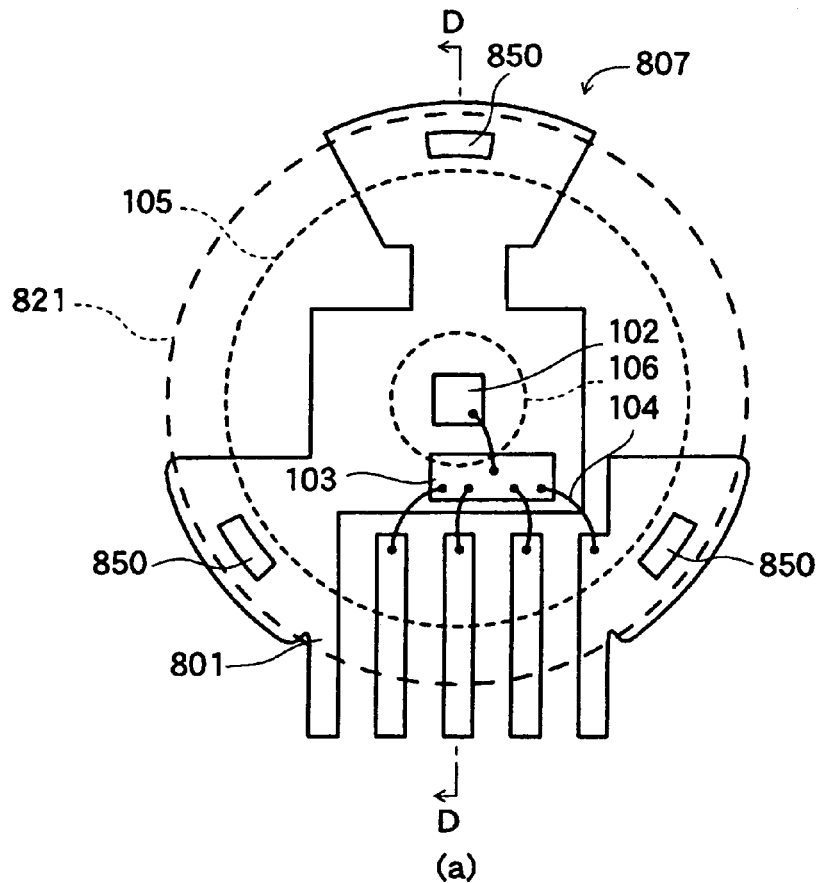
FIG. 12 is a front view showing an outline of a light emission unit of the optical transmission device according to Embodiment 8 of the present invention.
Figure 12:
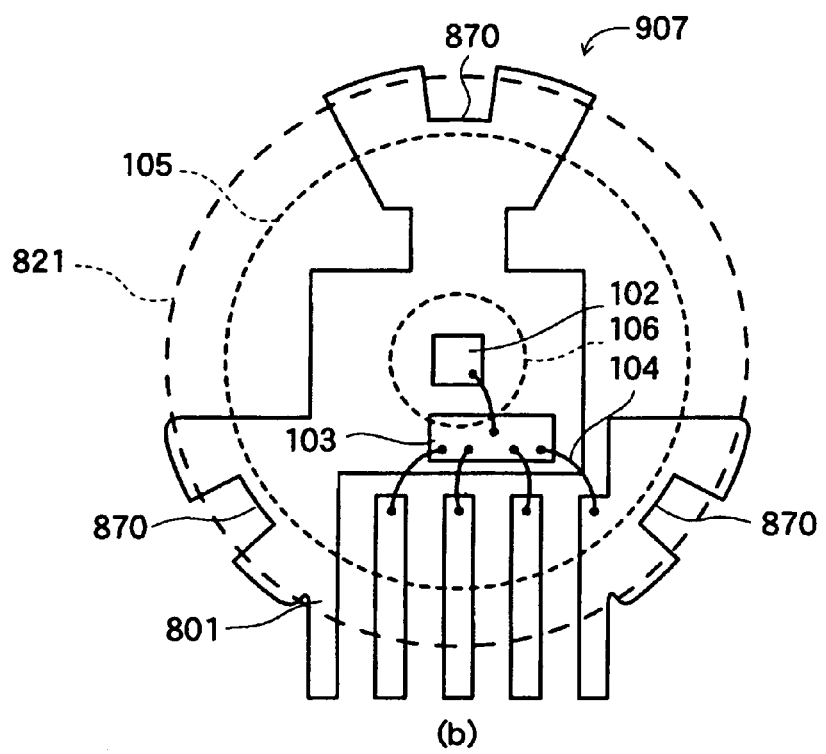

FIGS. 12(a) and 12(b) are front views showing outlines of light emission units 807 and 907 on which light emission elements 102 and peripheral IC 103 are mounted. In FIGS. 12(a) and 12(b), the positions of the respective outer peripheries of lenses 106, sealing resin 105 and sleeve members 821 corresponding therein are illustrated by the broken lines indicated by the same reference numerals. In FIG. 12(a), a lead frame 801 has arc-shaped through holes 850 on the circumference of a circle with a light emission element 102 at its center. Three through holes 850 are provided in a lead frame 801, and through holes 850 are arranged so as to be apart from each other at intervals of 120° or approximately 120° and symmetrically to the line D—D. On the other hand, in FIG. 12(b), a lead frame 801 shows the case where a lead frame 801 has notches 870 provided along an arc on the circumference of a circle with a light emission element 102 at its center instead of through holes 850 shown in FIG. 12(a). FIG. 11 shows a cross section view of an optical transmission device 800 taken along the line D—D shown in FIG. 12(a).

Referring to FIG. 11 again, a sleeve member 821 is made of translucent resin. The end portion of an optical fiber 14 is inserted in a sleeve member 821, whereby the position of the end portion of an optical fiber 14 relative to a sleeve member 821 is fixed. A sleeve member 821 comprises protrusion portions 860 so as to match through holes 850 shown in FIG. 12(a). Specifically, protrusion portions 860 have an arc-shaped section when viewed from its protrusion direction. Through holes 850 and protrusion portions 860 are provided in equal numbers, and in plural numbers. After protrusion portions 860 are inserted in through holes 850, protrusion portions 860 and through holes 850 are fixed to each other by adhesive 109. With such structure, the position of a light emission element 102 relative to a sleeve member 821 is fixed.

A light emission element 102 is located at the center of the circle on which three through holes 850 are provided. An optical fiber 14 is located at center of the end portion of a sleeve member 821, that is, at the center of the outer circumference contacting a light emission unit 807. Accordingly, protrusion portions 860 are inserted in through holes 850 so as to match both centers, whereby the centers of a light emission element 102 and an optical fiber 14 almost agree with each other. Thus, a light emission element 102 and an optical fiber 14 are optically coupled. A receptacle 808 is fitted to the respective external peripheries of a sleeve member 821, a connecting connector 15 and a light emission unit 807, and stabilizes the relative positions of them. This embodiment exhibits the same effects as those of Embodiment 1.

In this embodiment, when arc-shaped notches 870 are disposed on the circumference of the circle with a light emission element 102 at its center as shown in FIG. 12(b), the same effects obtained by foregoing through holes 850 of FIG. 12(a) can be achieved.

(Embodiment 9)

Figure 13:
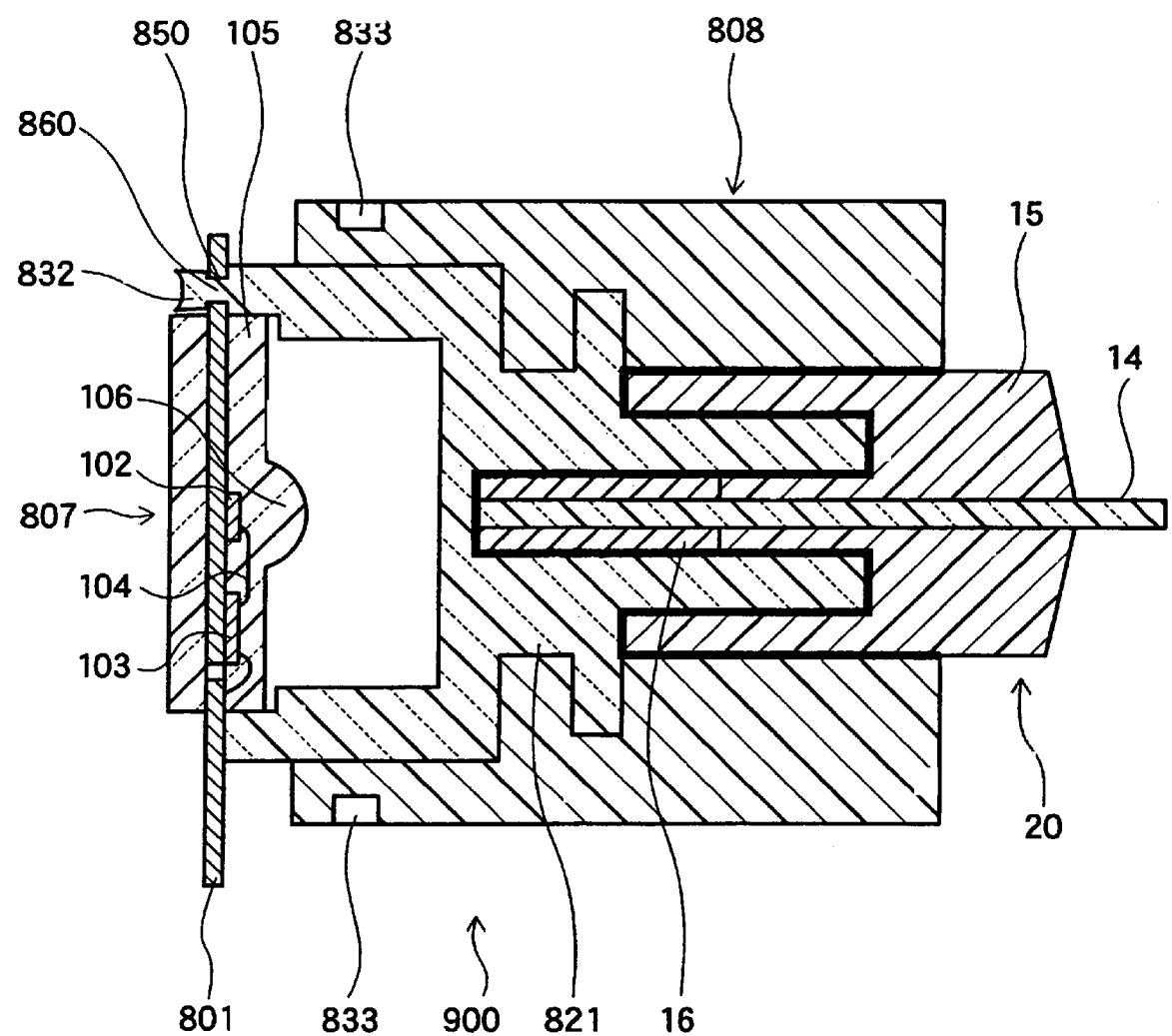
FIG. 13 is a cross section view showing an outline of an optical transmission device taken along an optical fiber according to Embodiment 9 of the present invention.

An optical transmission device according to Embodiment 9 of the present invention will be described with reference to FIG. 13. FIG. 13 is a cross section view showing an outline of an optical transmission device 900 taken along an optical fiber 14 that is an optical transmission path thereof. Note that, in this section view, the constituent components which do not appear in the cross section are virtually illustrated additionally. In this embodiment, a light emission unit 807 is fixed to a sleeve member 821 by heat caulking 832. Furthermore, a receptacle 808 is fixed to a sleeve member 821 by heat caulking 833. This embodiment is different from Embodiment 8 in these respects. Other constituent components of this embodiment may be the same as those in Embodiment 8.

After protrusion portions 860 are inserted in through holes 850 of a light emission unit 807, the tip ends of protrusion portions 860 undergo a heat treatment. With the heat treatment, heat caulking 832 is formed at the tip end of protrusion portions 860. Thus, the position of a light emission element 102 relative to a sleeve member 821 is fixed.

Furthermore, after a receptacle 808 is fitted to the outside of a sleeve member 821, heat caulking 833 is formed by performing the heat treatment while applying pressure to a sleeve member 821 from the exterior surface of a receptacle 808. A receptacle 808 is fixed to a sleeve member 821 by heat caulking 833.

According to this embodiment, adhesive, solder and nuts are unnecessary. Furthermore, this embodiment exhibits the same effects as those of Embodiment 8. When notches (not shown) are provided instead of through holes 850 as is the case with Embodiment 8, the same effects as those in this embodiment can be obtained.

(Embodiment 10)

Figure 14:
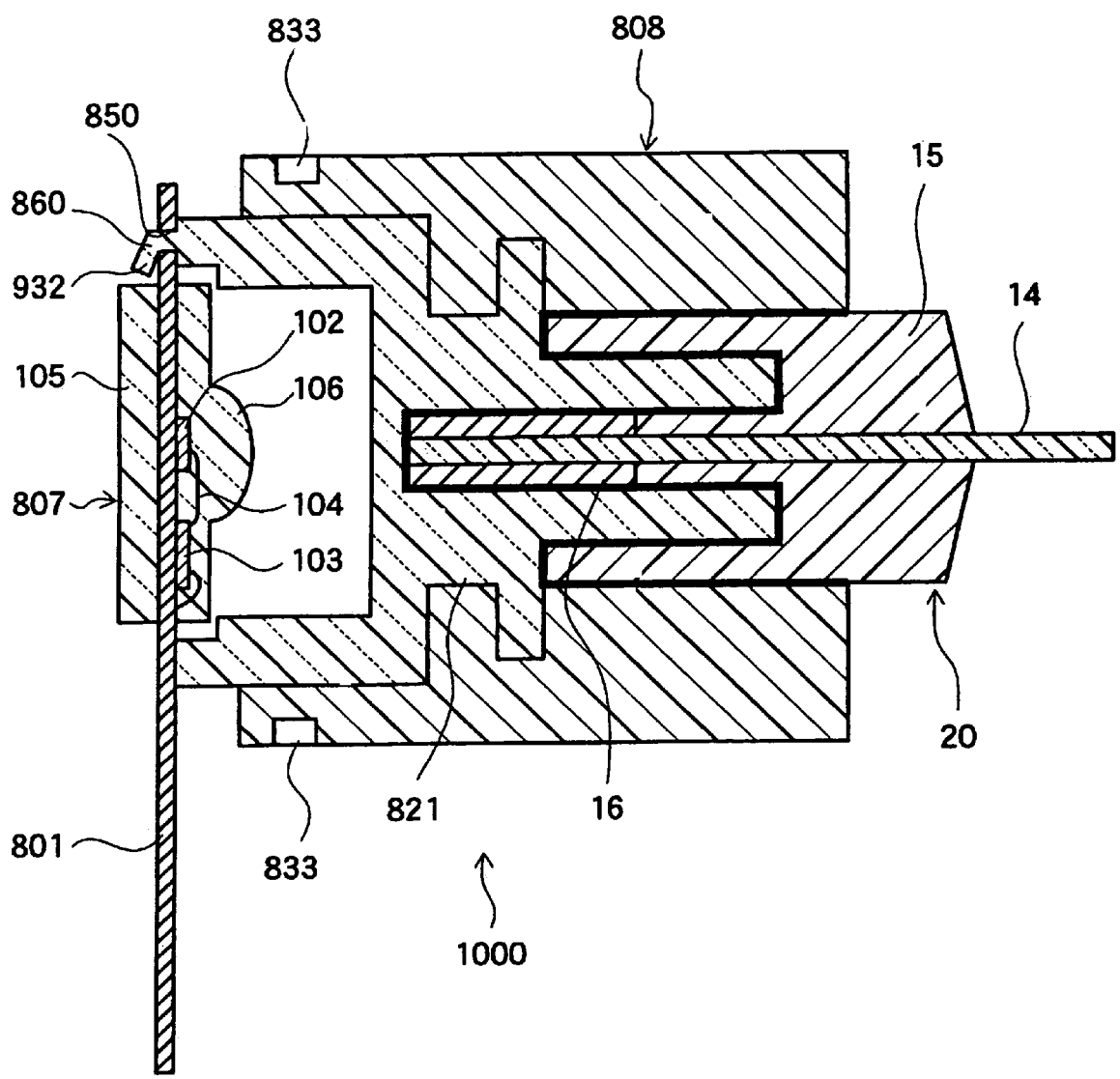
FIG. 14 is a cross section view showing an outline of an optical transmission device taken along an optical fiber according to Embodiment 10 of the present invention.

An optical transmission device according to Embodiment 10 of the present invention will be described with reference to FIG. 14. FIG. 14 is a cross section view of an optical transmission device 1000 taken along an optical fiber 14 that is an optical transmission path thereof. Note that, in this cross section view, the constituent components which do not appear in the cross section are virtually illustrated additionally. In this embodiment, a light emission unit 807 is fixed to a sleeve member 821 by bending and heat caulking 932. This embodiment differs from Embodiment 9 in this respect. Other constituent components of this embodiment may be the same as those of Embodiment 9.

After protrusion portions 860 are respectively inserted in through holes 850 of a light emission unit 807, the tips of three protrusion portions 860 simultaneously undergo a heat treatment and a treatment in which a force is applied in a direction of a light emission element 102. With such treatments, heat caulking 932 bent in the direction of a light emission element 102 is formed in each of the tips of protrusion portions 860. Thus, the position of a light emission element 102 relative to a sleeve member 821 is fixed.

According to this embodiment, the same effects as those of Embodiment 9 can be exhibited. In addition, since the force is simultaneously applied to the tips of three protrusion portions 860 in the direction of a light emission element 102 which is the center of the circumference on which protrusion portions are provided, of a light emission element 102, a positional deviation of a light emission element 807 relative to a sleeve member 821 can be suppressed to a small extent, and an optical coupling of a light emission element 102 and a optical fiber 14 can be stabilized. Note that, as is the case with Embodiment 8, an optical transmission device can achieve the same effects as those of this embodiment when notches (not shown) instead of through holes 850 are used.

(Embodiment 11)

Figure 15:
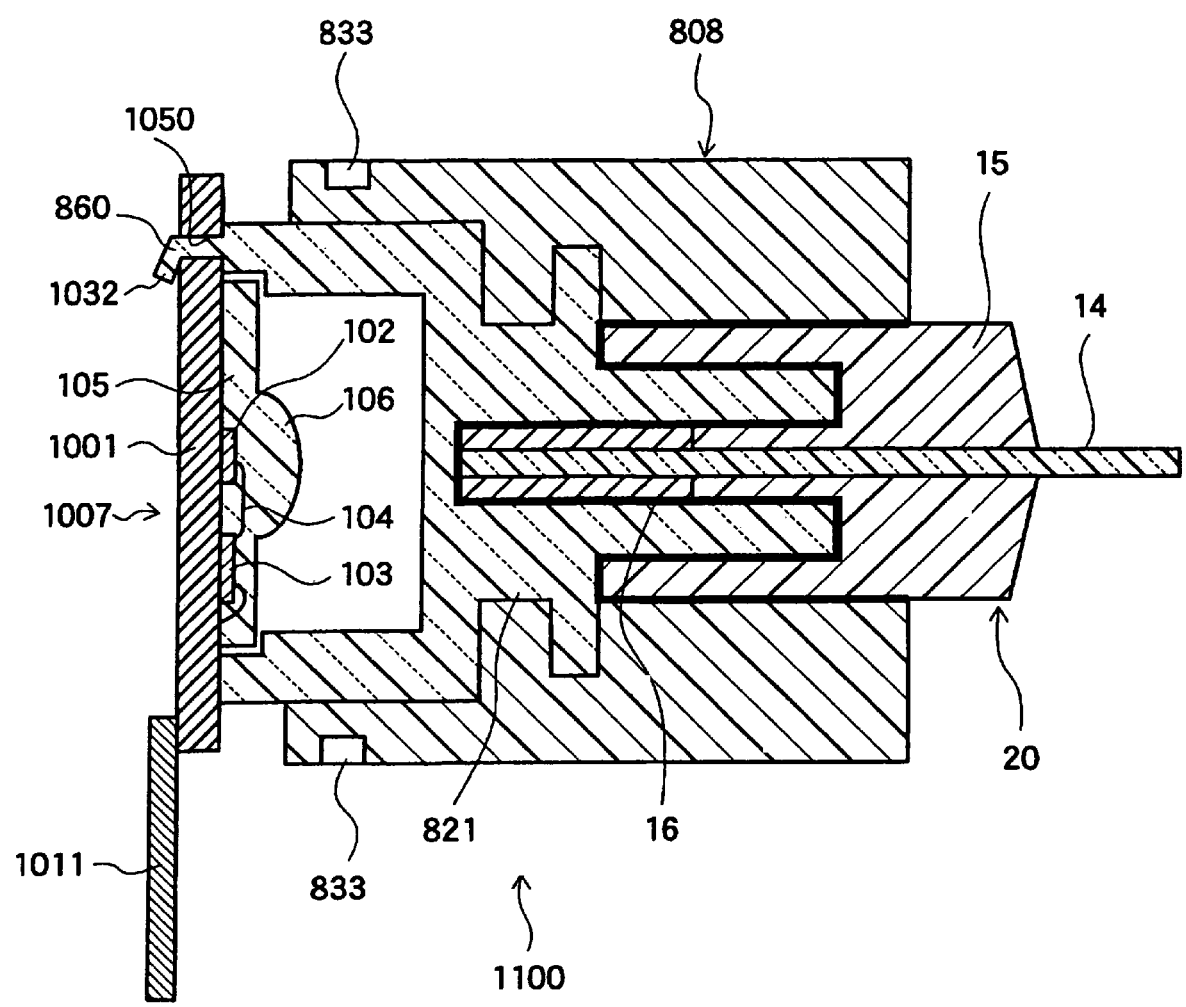
FIG. 15 is a cross section view showing an outline of an optical transmission device taken along an optical fiber according to Embodiment 11 of the present invention.

An optical transmission device according to Embodiment 11 of the present invention will be described with reference to FIG. 15. FIG. 15 is a cross section view of an optical transmission device 100 taken along an optical fiber 14 that is an optical transmission path thereof. Note that, in this section view, the constituent components which do not appear in the cross section are virtually illustrated additionally. In a light emission unit 1007 of this embodiment, both of a light emission element 102 and a peripheral IC 103 are mounted on a ceramic board 1001. This embodiment differs from Embodiment 10 in this respect. Other constituent components of this embodiment may be the same as those of Embodiment 10. A light emission unit of this embodiment differs from a light emission unit of Embodiment 4 using the same ceramic board as that of this embodiment in that a light emission unit of this embodiment is sealed by sealing resin 105 in which a lens is provided.

After protrusion portions 860 are respectively inserted in through holes 1050 of a light emission unit 1007, the tips of three protrusion portions 860 simultaneously undergo a heat treatment and a treatment in which a force is applied in a direction of a light emission element 102. With such treatments, heat caulking 1032 bent in the direction of a light emission element 102 is formed in each of the tips of protrusion portions 860. Thus, the position of a light emission element 102 relative to a sleeve member 821 is fixed. Note that, as is the case with Embodiment 4, a ceramic board 1001 may take any of a single-layered structure and a multilayered structured, and a wiring formed on the plane where a light emission unit 102 and the like are mounted and a lead wire 1011 connected to the plane on the other side of the former plane are connected to each other by, for example, a via-hole wiring (not shown).

According to this embodiment, the same effects as those of Embodiment 10 are exhibited. Note that, as is the case with Embodiment 8, an optical transmission device can achieve the same effects as those of this embodiment when notches (not shown) instead of through holes 1050 are used.

(Embodiment 12)

Figure 16:
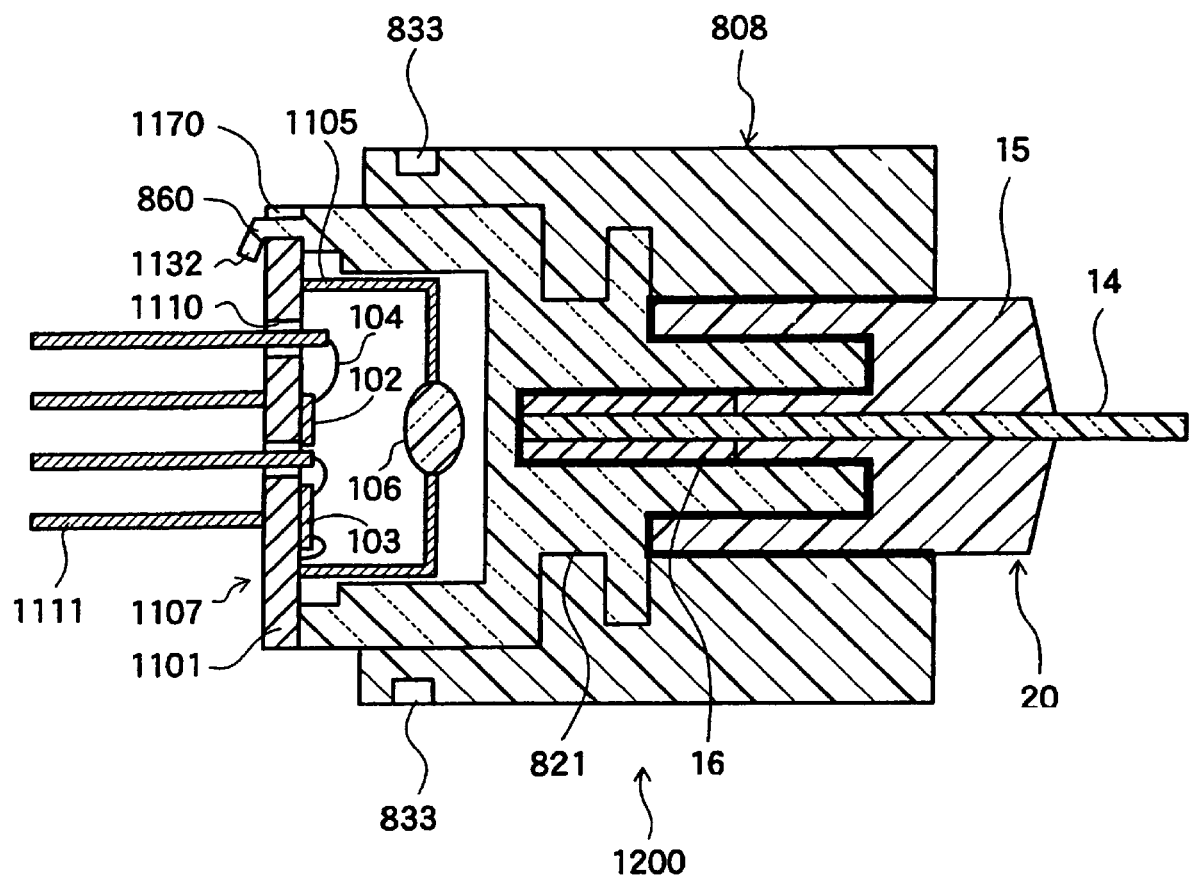
FIG. 16 is a cross section view showing an outline of an optical transmission device taken along an optical fiber according to Embodiment 12 of the present invention.

An optical transmission device according to Embodiment 12 of the present invention will be described with reference to FIGS. 16 and 17. FIG. 16 is a cross section view of a optical transmission device 1200 taken along an optical fiber 14 that is an optical transmission path thereof. Note that, in this cross section view, the constituent components which do not appear in the cross section are virtually illustrated additionally. In a light emission unit 1107 of this embodiment, both of a light emission element 102 and a peripheral IC 103 are mounted on a stem 1101, and sealed by a cap 1105 in which a lens 1106 is provided. This embodiment differs from the Embodiment 11 in these respects. Other constituent components of this embodiment may be the same as those of Embodiment 11.

A light emission unit 1107 includes a stem 1101 that is a mounting board, a light emission element 102, a peripheral IC 103, a gold wire 104, a cap 1105 and a lens 1106. A stem 1101 is made of a metal, and mounts a light emission element 102 and a peripheral IC 103. If an automatic mounter and the like are used when a light emission element 102 is mounted on a stem 1101, a light emission element 102 can be fixed to a predetermined position of a stem 1101 precisely. A lead 1111 extending in the direction perpendicular to the plane of a stem 1101 is electrically connected to a stem 1101, and a lead 1111 insulated by, for example, glass 1110 is connected to a stem 1101. A lead 1111 is electrically connected to a light emission element 102 and a peripheral IC 103 by a gold wire 104.

Figure 17:
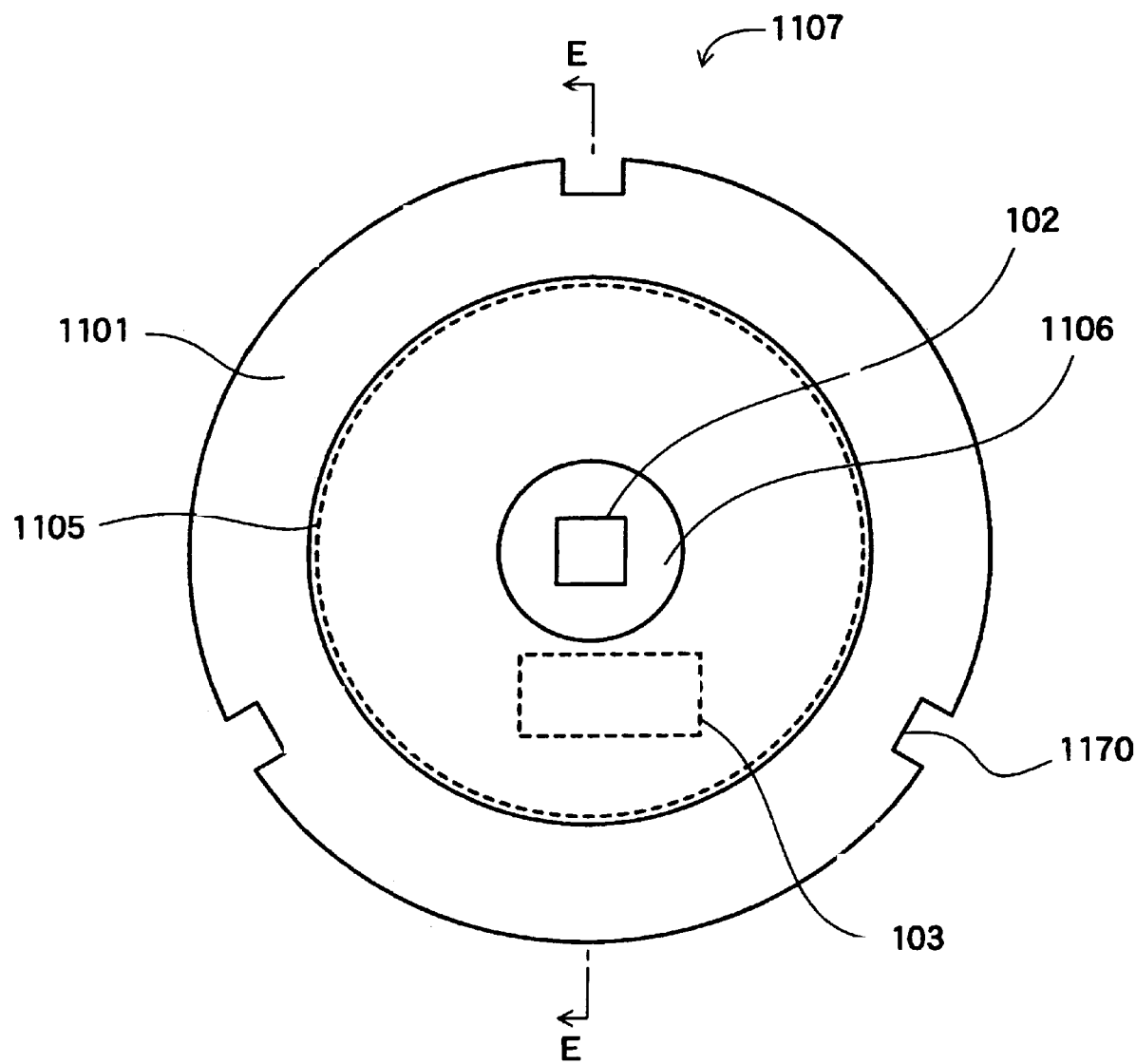
FIG. 17 is a front view showing an outline of a light emission unit of the optical transmission device according to Embodiment 12 of the present invention.

FIG. 17 is a front view showing an outline of a light emission unit 1107 on which a light emission element 102 and a peripheral IC 103 are mounted. Illustrations of a lead 1111 and a gold wire 104 and the like are omitted. As shown in FIG. 17, in a stem 1101 having a circular external shape, a light emission element 102 is located at the center of the circle, and notches 1170, for example three of them, having the same shape are provided on the circumference of the concentric circle. These notches 1170 have surface forming a part of the circumference of the circle, and are arranged at equal intervals so as to be apart at intervals of 120° from each other. A cap 1105 made from a metal disposed so that the center of a lens 1106 is vertically just above that of a light emission element 102 is fixed to a stem 1101, and hermetically seals a light emission element 102, a peripheral IC 103 and the like. FIG. 16 shows a cross section view of an optical transmission device 1200 taken along the line E-E shown in FIG. 17.

Referring to FIG. 16 again, after protrusion portions 860 are respectively inserted in notches 1170 of a light emission unit 1107, the tips of three protrusion portions 860 simultaneously undergo a heat treatment and a treatment in which a force is applied in a direction of a light emission element 102. With such treatments, heat caulking 1132 bent in the direction of a light emission element 102 is formed in each of the tips of protrusion portions 860. Thus, the position of a light emission element 102 relative to a sleeve member 821 is fixed.

According to this embodiment, the same effects as those of Embodiment 11 are exhibited. In addition, an optical coupling of an optical fiber 14 and a light emission element 102 of a light emission unit 1107 having a structure excellent in a hermetic seal can be stabilized, and it is possible to provide the optical transmission device capable of operating under severe environment. Note that an optical transmission device can achieve the same effects as those of this embodiment when through holes (not shown) instead of notches 1170 are used.

The present invention is not limited to the above described embodiments, and various modifications can be embodied without departing from the scope and spirit of the present invention.

For example, in Embodiment 5 to Embodiment 7, a receptacle 208 shown in FIG. 3 may be used instead of receptacles 508, 608 and 708. In this case, a lens 106 needs not to be provided in a sealing resin 105 of a light emission unit 107. With such structure, the same effects as those of Embodiment 2 are added to the effects of Embodiments 5 to 7.

In Embodiments 8 to 12, lenses 106 and 1106 may be provided in sleeve members 821 as is similar to the structure shown in FIG. 3. With such structure, the same effects as those of Embodiment 2 are added to the effects of Embodiments 8 to 12.

The lens may adopt a two group system in which the lens is provided in the light emission unit as well as in the sleeve member. Based on several factors such as the distance between a light emission element 102 and an optical fiber 14 and the material of a lens, a selection by which the most suitable optical coupling efficiency can be obtained is possible.

Furthermore, in Embodiments 9 to 12, the examples were shown, in which the positional precision of a light emission element 102 and a optical fiber 14 is secured by simultaneously forming heat caulking 1132 of protrusion portions 860 inserted in three through holes 850 and 1050 or three notches 870 and 1170 arranged on the concentric circle while applying the force toward the center of a sleeve member 821. In addition to this example, the same effects as those described above can be achieved by arranging through holes or notches at diametrically opposite positions and by simultaneously performing heat caulking for protrusion portions inserted in these holes or notches while applying a force toward the center. In this case, the through holes and the notches are arranged in even numbers, for example, by four when the lines respectively connecting the opposite two through holes or notches intersect at the right angle.

Although a light emission element 102 is used in the above described embodiments, a light receiving element (not shown) may be used instead of the light emission element. Specifically, this embodiment may be constituted as an light emission device or a light receiving device (not shown). In this case, the light receiving device is constituted so that it receives an optical signal from an optical fiber 14, and converts the optical signal to an electrical signal. As a matter of course, accompanied with the adoption of the light receiving element, the peripheral IC is changed for use in receiving the electrical signal.

Furthermore, though non-conductive resin is used as the receptacle and the sleeve member of the above described embodiments, they may be made of conductive materials. For example, when the receptacle and the sleeve member need not to be translucent, they may be made of metals, or they may be made of resin mixed with metal filler. Particularly, when the embodiments of the present invention are constituted as the light receiving device, this light receiving device can decrease electromagnetic noises by making the receptacle or the sleeve member to be conductive.

What is claimed is:

1. An optical transmission device comprising:
    a photonic element converting an electrical signal supplied from an electronic device to an optical signal sent to an optical transmission path, or converting an optical signal received from the optical transmission path to an electrical signal;
    a mounting board mounting the photonic element and having at least one hole or notch at a position determined with reference to a mounted position of the photonic element; and
    a coupling portion having a protrusion portion inserted in the hole or the notch to relatively fix a position of the mounting board, and an optical transmission path insertion port in which an end portion of the optical transmission path is inserted and which relatively fixes a position of the optical transmission path, the coupling portion optically coupling the photonic element and the optical transmission path,
    wherein the protrusion portion has a caulking portion in order to relatively fix a position of the mounting board, and the caulking portion is located at a tip of the protrusion portion, and the caulking portion is bent toward a direction where the photonic element is mounted, and the coupling portion has three protrusion portions separated at angles of approximately 120°, and the photonic element is provided in a center of a circumference on which the protrusion portions are symmetrically provided.

2. The optical transmission device according to claim 1, wherein the mounting board and the coupling portion comprise a metal having an affinity for solder.

3. The optical transmission device according to claim 1, wherein the coupling portion is screwed to the mounting board.

4. The optical transmission device according to claim 1, wherein the protrusion portions are fixed to the mounting board by adhesive.

5. The optical transmission device according to claim 1, wherein the protrusion portions have caulking portions having tips pointed approximately toward a direction of light emission element.

6. The optical transmission device according to claim 1, comprising plural of said holes or notches provided on a circumference of a circle with the photonic element of the mounting board at a center of the circle, wherein the protrusion portions are provided on a circumference of a circle with the optical transmission path of the coupling portion, and the optical transmission path is located at a center of the circle.

7. The optical transmission device according to claim 1, wherein coupling portions of the respective protrusion portions connecting with the coupling portions have an area larger than that of the holes or notches, and a distance between the photonic element and the optical transmission path is determined by contacting a peripheral portion of the mounting board around one of the hole and the notch with the connection portion.

8. The optical transmission device according to claim 1, wherein the at least one hole or notch provided on the mounting board has an arc shape on a circumference of a circle with the photonic element, and the photonic element is located at a center of the circle, and the protrusion portions are provided in the coupling portion so as to form an arc shape on a circumference of a circle with the optical transmission path, and the optical transmission path is located at a center of the circle.

9. The optical transmission device according to claim 1, wherein the coupling portion further includes a translucent lens provided so as to be positioned in front of an end face of the optical transmission path when the optical transmission path is inserted in the optical transmission path insertion port.

10. The optical transmission device according to claim 1, wherein the coupling portion comprises a translucent resin.

11. The optical transmission device according to claim 1, wherein the coupling portion comprises a conductive material.

12. The optical transmission device according to claim 1, wherein a hollow space is provided between the photonic element and the coupling portion.

13. The optical transmission device according to claim 1, wherein the mounting board comprises a ceramic.

14. The optical transmission device according to claim 1, wherein the mounting board comprises a metal.

15. An optical transmission device comprising:
    a photonic element converting an electrical signal supplied from an electronic device to an optical signal sent to an optical transmission path, or converting an optical signal received from the optical transmission path to an electrical signal;

a mounting board mounting the photonic element and having at least one hole or notch at a position determined with reference to a mounted position of the photonic element; and a coupling portion having a protrusion portion inserted in the hole or the notch to relatively fix a position of the mounting board, and an optical transmission path insertion port in which an end portion of the optical transmission path is inserted and which relatively fixes a position of the optical transmission path, the coupling portion optically coupling the photonic element and the optical transmission path, wherein the protrusion portion has a caulking portion in order to relatively fix a position of the mounting board, and the caulking portion is located at a tip of the protrusion portion, and the at least one hole or notch has a polygonal shape having three or more corners or constitutes a part of a polygonal shape, and a cross-sectional shape of the protrusion portion inserted in the polygonal hole or notch also has a polygonal shape having three corners or more or constitutes a part of the polygonal shape when viewed from a protrusion direction of the protrusion portion.

16. An optical transmission device comprising:

a photonic element converting an electrical signal supplied from an electronic device to an optical signal sent to an optical transmission path, or converting an optical signal received from the optical transmission path to an electrical signal;

a mounting board mounting the photonic element and having at least one hole or notch at a position determined with reference to a mounted position of the photonic element; and a coupling portion having a protrusion portion inserted in the hole or the notch to relatively fix a position of the mounting board, and an optical transmission path insertion port in which an end portion of the optical transmission path is inserted and which relatively fixes a position of the optical transmission path, the coupling portion optically coupling the photonic element and the optical transmission path, wherein the protrusion portion has a caulking portion in order to relatively fix a position of the mounting board, and the caulking portion is located at a tip of the protrusion portion, and the at least one hole or notch has an elliptic shape or constitutes a part of an elliptic shape, and a cross-sectional shape of the protrusion portion inserted in the elliptic hole or notch also has an elliptic shape or constitutes a part of the elliptic shape when viewed from a protrusion direction of the protrusion portion.

* * * * *